United States Patent
Maniwa et al.

(10) Patent No.: US 6,577,192 B2
(45) Date of Patent: Jun. 10, 2003

(54) PREDISTORTION-TYPE DISTORTION COMPENSATION AMPLIFYING APPARATUS

(75) Inventors: Toru Maniwa, Kawasaki (JP); Tsuyoshi Hasegawa, Kawasaki (JP); Yoshihiro Kawasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/042,440

(22) Filed: Nov. 9, 2001

(65) Prior Publication Data

US 2002/0079965 A1 Jun. 27, 2002

Related U.S. Application Data

(63) Continuation of application No. PCT/JP99/02824, filed on May 28, 1999.

(51) Int. Cl.$^7$ .................................................. H03F 1/26
(52) U.S. Cl. ............................................ 330/149; 330/2
(58) Field of Search ........................... 330/2, 129, 149, 330/144

(56) References Cited

U.S. PATENT DOCUMENTS

| | | | |
|---|---|---|---|
| 4,476,438 A | | 10/1984 | Cantou |
| 5,113,414 A | * | 5/1992 | Karam et al. ............ 330/149 X |
| 5,164,678 A | | 11/1992 | Puri et al. |
| 5,798,854 A | | 8/1998 | Blauvelt et al. |
| 6,118,335 A | * | 9/2000 | Nielsen et al. ................. 330/2 |
| 6,240,278 B1 | * | 5/2001 | Midya et al. ............ 330/149 X |

FOREIGN PATENT DOCUMENTS

| | | |
|---|---|---|
| EP | 0067091 | 12/1982 |
| EP | 0085600 | 8/1983 |
| EP | 0433863 | 6/1991 |
| EP | 0441580 | 8/1991 |
| JP | 4016006 | 1/1992 |
| JP | 9083417 | 3/1997 |

OTHER PUBLICATIONS

Takabayashi, et al. A Study of Transmitting Linearizer using Digital Quadrature Modem. Matsushita Research Institute Tokyo, Inc. Oct. 1, 1998.

Iwasaki, et al. A Performance of Transmitter with Digital Adaptive Pre-distorter Oct. 1, 1998.

* cited by examiner

*Primary Examiner*—Steven J. Mottola
(74) *Attorney, Agent, or Firm*—Katten Muchin Zavis Rosenman

(57) ABSTRACT

In the mobile communication, a distortion compensation amplifying apparatus is provided. In a predistortion-type distortion compensation amplifying apparatus (9), a signal amplitude change processing unit (10) comprises an odd-power component calculating unit (14) extracting a power component of odd order of an amplitude quantity contained in a signal to be transmitted and outputting it, a coefficient information outputting unit (15) being operable to select one of plural pieces of coefficient information based on a signal from the outside and output it, a multiplying unit (16) multiplying a signal outputted from the odd-power component calculating unit (14) by coefficient information from the coefficient information outputting unit (15) and outputting an attenuation signal, and an adding unit (17) subtracting the attenuation signal from the signal to be transmitted and outputting a result, thereby making an amplifier operate within a range not exceeding a saturation region thereof, decreasing a spurious signal, decreasing an adjacent channel power, and enabling distortion compensating operation even if a frequency of reference to the memory is decreased.

14 Claims, 23 Drawing Sheets

PREDISTORTION-TYPE DISTORTION COMPENSATION AMPLIFYING APPARATUS

"This application is a continuation of international application number PCT JP99/02824, filed May 28, 1999. (status, abandoned, pending, etc.)."

TECHNICAL FIELD

The present invention relates to a predistortion-type distortion compensation amplifying apparatus suitable for use in a high-frequency circuit for mobile communication.

BACKGROUND ART

In mobile communication, a digital modulation system is used to increase the efficiency of frequency utilization, etc. In such case, distortion caused by non-linearity of characteristics of a power amplifier disturbs the adjacent channel, which is a problem. In order to prevent disturbance to the adjacent channel, a power amplifier having a low adjacent channel power (ACP: Adjacent Channel Power) is required. However, a use of the power amplifier within a linear operation region is not always advisable in view of the circuit scale and cost. Instead, a predistortion (hereinafter also referred as distortion compensation) is used in many cases.

Predistortion is a method of beforehand distorting an input signal to be amplified using a function representing a reverse characteristic of an input-output characteristic of the amplifier (power amplifier: hereinafter, the power amplifier being simply referred as an amplifier occasionally) when the signal is inputted to the amplifier. Namely, predistortion is a technique of beforehand distorting an input signal to be amplified and amplifying it, whereby a signal which has been linearized appears at the output of the amplifier.

FIG. 18 is a diagram showing an example of the radio transceiver using predistortion. In a radio transceiver 50 shown in FIG. 18, a baseband signal to be transmitted is modulated and predistorted in a digital signal processor (DSP: Digital Signal Processor) 50a, where a distortion compensation coefficient operating process is performed to estimate non-linear distortion of a power amplifier 50c. In a quadrature modulating-demodulating unit 50b, the processed baseband signal is up-converted into the RF (Radio Frequency) band. In the power amplifier 50c, a predetermined power is applied to the signal, and the signal is fed to an antenna 50e via a synthesizer 50d and transmitted.

On the other hand, the modulated signal fed back from a part of the signal outputted from the power amplifier 50c is down-converted into a baseband signal having a distorted component in the quadrature modulating-demodulating unit 50b. The converted signal is inputted to the digital signal processor 50a, where a distortion compensation coefficient operating process is performed. Accordingly, an RF signal free of distortion is outputted from the antenna 50e by this loop process. In the structure shown in FIG. 18, predistortion is performed in the baseband. Signal processing in the baseband will be now described with reference to FIG. 19, corresponding to equations.

FIG. 19 is a diagram showing an example of a known predistortion circuit (also referred as a predistorter). A quadrature modulator 60 shown in FIG. 19 performs the distortion compensation coefficient operating process, which comprises memories 61 and 62, multipliers 63a, 63b, 63c and 64d, and adders 64a and 64b. Baseband signals I and Q are undergone the distortion compensation operating process by referring to the respective memories 61 and 62 (memory regions denoted by reference characters 61a, 61b, 61c and 61d, and memory regions denoted by reference characters 62a, 62b, 62c and 62d) in a software process or the like. The signals processed in these memories 61 and 62 are multiplied in the multipliers 63a–63d, added in the adders 64a and 64b, and $I_{pd}$ and $Q_{pd}$ are outputted.

When an output of an amplifier is $P_o(t)$, the output is expressed by a product of a function f(t) of amplitude and a function g(t) of phase as shown in Equation (1):

$$P_o(t) = f\{M_i(t)\} \cdot \exp[(-j \cdot g\{M_i(t)\}) \cdot \exp(\omega t) \qquad (1)$$

where, $M_i(t)$ is magnitude of amplitude of a modulated wave, $\omega$ is a center frequency, t is a time, and j is an imaginary unit which represents $j^2 = -1$.

When input signals to the quadrature modulator 60 are I(t) and Q(t), magnitude x(t) of amplitude of a modulated wave inputted to the amplifier are expressed by Equation (2) (operation in the memory regions 61a and 62a shown in FIG. 19):

$$x(t) = \sqrt{(I(t)^2 + Q(t)^2)} \qquad (2)$$

Magnitude y(t) of amplitude of a modulated wave component outputted from the amplifier is expressed, with G being a gain, by Equation (3):

$$y(t) = G \cdot x(t) \qquad (3)$$

FIG. 12 is a diagram showing an example of the input-output characteristic of the amplifier. A part denoted by B1 in FIG. 12 is a non-saturation region, whereas a part denoted by B2 is a saturation region. The input-output characteristic changes its characteristic at a point denoted by A, which is a function having an upper limit because of the saturation characteristic of the amplifier. In order to compensate the distortion of an output signal amplified as expressed by Equation (3), distortion compensation using an inverse function $f^{-1}(t)$ of the function f(t) of amplitude within the quadrature modulator 60 is performed. An output $P_{pd}(t)$ of the amplifier undergone the distortion compensation is expressed by Equation (4):

$$P_{pd}(t) = f^{-1}(y) \cdot \exp[j \cdot g\{f^{-1}(y)\}] \cdot \exp(\omega t) \qquad (4)$$

Namely, $I_{pd}(t)$ and $Q_{pd}(t)$ which are deformed I(t) and Q(t) (hereinafter abbreviated as $I_{pd}$ and $Q_{pd}$, respectively) are expressed by Equations (5) and (6), respectively:

$$I_{pd} = \{f^{-1}(y)/x\} \cdot [I \cos [g\{f^{-1}(y)\}] - Q \sin [g\{f^{-1}(y)\}]] \qquad (5)$$

$$Q_{pd} = \{f^{-1}(y)/x\} \cdot [Q \cos [g\{f^{-1}(y)\}] + I \sin [g\{f^{-1}(y)\}]] \qquad (6)$$

where x(t) and y(t) are abbreviated as x and y. Generally, input-output relationships of the Equations (5) and (6) are stored in the memories 61 and 62 as a reverse characteristic of the characteristic as shown in FIG. 12. Values of I(t) and Q(t) are, for example, very frequently referred at sampling time intervals for digital signals, and the outputs $I_{pd}$ and $Q_{pd}$ are obtained.

Namely, y is determined from data in the memory region 61b shown in FIG. 19, then $f^{-1}(y)/x$ in the Equations (5) and (6) is calculated from y and data in the memory region 61c. Further, $\{f^{-1}(y)/x\} \cdot I$ in the Equation (5) and $\{f^{-1}(y)/x\} \cdot Q$ in the Equation (6) are calculated from data in the memory region 62b, and outputted. Similarly, y is determined form data in the memory region 62b, then $g\{f^{-1}(y)\}$ in the Equations (5) and (6) is calculated from y and data in the memory region 62c. Further, $\cos[g\{f^{-1}(y)\}]$ and $\sin[g\{f^{-1}$ $_1(y)\}$] in the Equations (5) and (6) are calculated from data in the memory region 62d, and outputted. These outputs are added in the multipliers 63a–63d, after which, added in the adders 64a and 64b, and deformed $I_{pd}$ and $Q_{pd}$ are outputted. As this, distortion compensation is performed using a predistortion circuit as the quadrature modulator 60 to make the amplification characteristic of the amplifier linear, in general.

Incidentally, as a method for compensating a frequency characteristic in the vicinity of higher harmonic in bias circuits of the amplifier and the power circuit (not shown), and a matching circuit, there has been proposed a method of determining a coefficient from a differential value or an integral value of an amplitude quantity of an input signal, and multiplying the original signal by the coefficient to obtain a predistortion signal.

FIG. 20 is a diagram showing an example of a predistortion circuit using a differential value or an integral value of an input signal. In a predistortion circuit 70 shown in FIG. 20, magnitude of amplitude of a demodulated wave with respect to input signals I and Q is calculated in an amplitude calculating unit 70a, $f^{-1}(y)$ is calculated in an inverse function calculating unit 70b, a differential value or an integral value of an amplitude quantity of the input signals is calculated in a differential/integral coefficient information adding unit 70c, an appropriate coefficient is obtained in a coefficient table 70d, the coefficient is multiplied in each of multipliers 70e and 70f, then $I_{pd}$ and $Q_{pd}$ are outputted.

However, when linearlization by Equation (3) is performed in the circuits shown in FIGS. 19 and 20, distortion increases. FIG. 23 is a diagram showing an input-output characteristic of a linearized amplifier. Since the input-output characteristic becomes discontinuous at a point (refer to a point A) where the output changes to the saturation region as shown in FIG. 23, distortion increases when the input signal steps into this region, which is a problem. This distortion will be now described with reference to FIGS. 21(a), 21(b), 22(a) and 22(b).

FIG. 21(a) is a diagram showing an example of a signal wave in the case where two waves having an equal amplitude are inputted. FIG. 21(b) is a diagram showing a spectrum of the signal shown in FIG. 21(a). As shown in FIG. 21(b), this signal has components of only frequencies $f_1$ and $f_2$.

FIG. 22(a) is a diagram showing an example of a signal waveform in the case where the signal shown in FIG. 21(a) is amplified by an amplifier having the input-output characteristic shown in FIG. 23. FIG. 22(b) is a diagram showing a spectrum of the signal shown in FIG. 22(a). As shown in FIG. 22(b), there is a problem which a spurious signal generates over a wide range of the frequency.

Moreover, since the frequency of reference to the memory is equal to a sampling time for the signal, the memory reference cannot catch up with in the case of a signal changing at a high speed, which leads to a difficulty in applying it to a high-speed signal. There is another problem which a predistortion circuit as shown in FIG. 19 generates an error in a coefficient to be referred when the characteristic varies due to a change in temperature or a change with time of the amplifier.

In the light of the above problems, the present invention provides a predistortion-type distortion compensation amplifying apparatus not requiring an external RF circuit having a linear amplification characteristic such as a feed-forward-type amplifier, which can decrease a spurious signal by adding an odd-power component to an input signal to make the amplifier operate within a range not exceeding the saturation region of the amplifier, decrease the adjacent channel power by multiplying the odd-power component of the input signal by a coefficient (coefficient information) and adding the result to the input signal, and perform a distortion compensating operation even if the frequency of reference to the memory is decreased.

DISCLOSURE OF INVENTION

A predistortion-type distortion compensation amplifying apparatus according to this invention comprises an amplifier for amplifying a signal to be transmitted, and a signal processing unit provided on the front side of the amplifier to perform a coefficient changing process to change coefficient information of a power component of an amplitude quantity contained in the signal to be transmitted, and being operable to output a processed signal.

Accordingly, it is possible to decrease spurious signals generating in a wide range of a frequency, and decrease the adjacent channel power. Additionally, even if characteristics of the amplifier vary due to a change in temperature or a change with time, it is possible to cope with it by comparing a part of an output signal and a part of an input signal, calculating an error therebetween, and rewriting a coefficient table when the error is large.

The signal processing unit performs a process with a function representing a reverse characteristic of an input-output characteristic of the amplifier on the signal to be transmitted, performs a coefficient changing process, and makes an odd-order component appear in an output signal of the amplifier, and the amplifier operates in a non-saturation region.

Accordingly, it is possible to prevent spurious from spreading over a wideband, and perform distortion compensation without an external RF circuit having a linear amplification characteristic. It is also possible to contribute to a reduction of the power consumption and allow compactness of the circuit scale. Further, a frequency characteristic in the vicinity of higher harmonic in a bias circuit of the amplifier, a bias circuit of the power circuit or a matching circuit, which leads to improvement of the accuracy.

The signal processing can decrease contribution of a power component of odd order of an amplitude quantity contained in the signal to be transmitted when performing a coefficient changing process.

Accordingly, the adjacent channel power which is a problem in a spurious signal is decreased, an external RF circuit having a linear amplification characteristic becomes unnecessary, and the circuit scale can be reduced, which leads to contribution to a reduction of the power consumption and allows compactness of a portable telephone or the like. Frequency of reference to the coefficient table becomes equal to a time for switching an average output power, it is thus possible to form the circuit with a memory having a relatively slow access speed.

BRIEF DESCRIPTION OF DRAWINGS

FIG. 13($b$) is a diagram showing a signal spectrum of an output waveform in the case where the signal waveform is amplified by an amplifier;

FIG. 14($b$) is a diagram showing a signal spectrum of an output waveform in the case where the signal waveform is amplified by an amplifier;

FIG. 21($b$) is a diagram showing a spectrum of the signal;

FIG. 22($b$) is a diagram showing a spectrum of a signal; and

BEST MODE FOR CARRYING OUT THE INVENTION (A) Description of First Embodiment of the Invention FIG. 1 is a block diagram of a predistortion-type distortion compensation amplifying apparatus in a transmitting unit of a radio transmitter, to which the present invention is applied. A radio transmitter 7 shown in FIG. 1 comprises a predistortion-type distortion compensation amplifying apparatus 9 and an antenna 13. The predistortion-type distortion compensation amplifying apparatus 9 beforehand distorts a digital baseband signal (signal to be transmitted) inputted from an external circuit with a function representing a reverse characteristic of an input-output characteristic of an amplifier 12, then amplifies it. The predistortion-type distortion compensation amplifying apparatus 9 comprises a signal processing unit 8 and the amplifier 12. The antenna 13 transmits a radio signal outputted from the predistortion-type distortion compensation amplifying apparatus 9. A signal inputted from the left side in FIG. 1 is not directly amplified by the amplifier 12 and transmitted, but is added distortion thereto in the signal processing unit 8 and transmitted. The antenna 13 also has, for example, a receiving function, detailed description of which is omitted. Similarly, with respect to parts which will be described later in each of embodiments and modifications and have also functions of the receiving system, detailed descriptions of receiving functions of which will be omitted, only functions of the transmitting system will be described.

The amplifier 12 amplifies a signal to be transmitted. The signal processing unit 8 is disposed in the front stage of the amplifier 12 to perform a coefficient changing process to change coefficient information on a power component of an amplitude quantity contained in the signal to be transmitted, and can output a processed signal (predistortion signal). Here, the amplifier 12 signifies a power amplifier. In the following description, "amplification" will signify "power amplification".

"Amplitude quantity" concretely represents magnitude x (t) (hereinafter abbreviated as x) of amplitude of a signal. "Power component" of the amplitude quantity represents a term of the third power $A_2 \cdot X^3$ or a term of the fifth power $A_4 \cdot X^5$ of the amplitude quantity x. The coefficient information is a coefficient $A_2$ or $A_4$ of the power component, which is a complex number including a phase component. These terms will be used in the same meanings in the following embodiments and modifications. In the following description, power will be referred as the third order or the third power, signifying the same contents.

Figure 2:
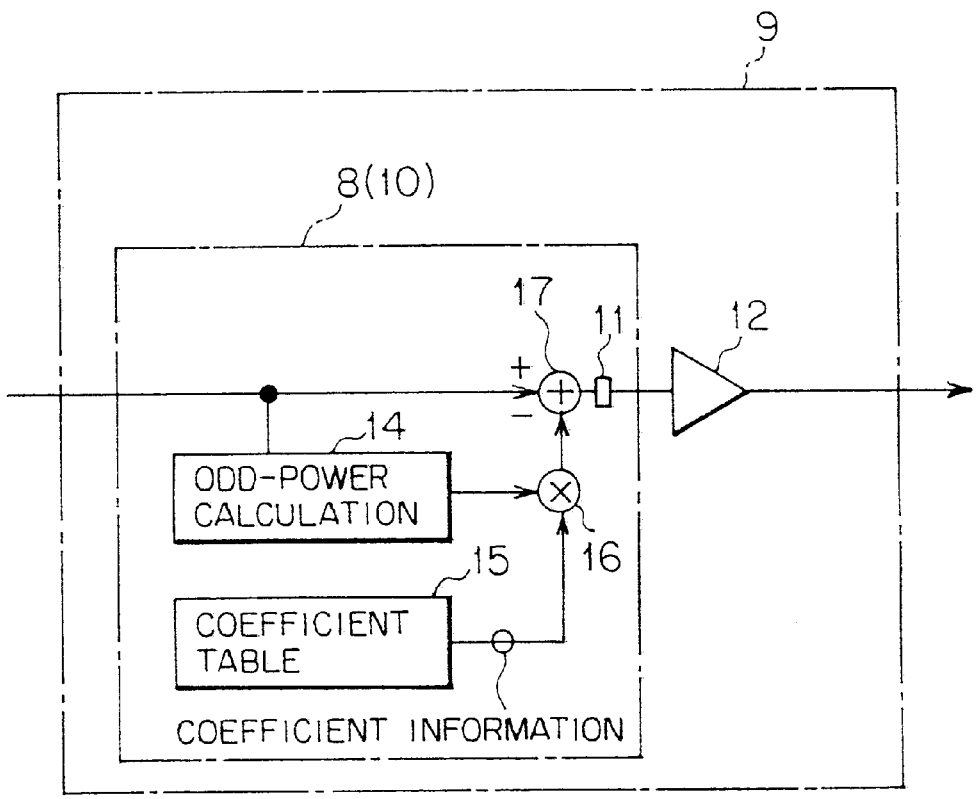
FIG. 2 is a block diagram of a predistortion-type distortion compensation amplifying apparatus according a first embodiment of this invention.

FIG. 2 is a block diagram of a predistortion-type distortion compensation amplifying apparatus 9 according to a first embodiment of this invention. The predistortion-type distortion compensation amplifying apparatus 9 shown in FIG. 2 comprises a signal processing unit 8 and an amplifier 12. The signal processing unit 8 is configured as a signal amplitude change processing unit 10 which can output a processed signal so as to decrease contribution of power components of odd orders of an amplitude quantity contained in a signal to be transmitted. The signal amplitude change processing unit 10 comprises an odd-power (odd-order) component calculating unit 14, a coefficient table (coefficient information outputting unit) 15, a multiplying unit 16, an adding unit 17, and a D/A converting unit 11.

The odd-order component calculating unit 14 extracts power components of odd orders of an amplitude quantity contained in a signal to be transmitted, and outputs them. The odd-order component calculating unit 14 extracts the components from a signal to be transmitted in software processing. Incidentally, the odd-order component calculating unit 14 comprises third-power component calculating units 14a and 14b, as will be described later.

The coefficient table (coefficient information outputting unit) 15 can select one of plural pieces of coefficient information according to a signal from the outside, and output it. For the coefficient table 15, a rewritable memory such as a RAM (Random Access Memory), a flash ROM (Flash Read Only Memory) or the like is used. As a value of the coefficient information, coefficient information according to an output power which is a target is stored. As will be described later, the coefficient table 15 comprises coefficient tables 15a and 15b.

When the output power is changed, coefficient information according to an output power which is a target is referred, and multiplied. Frequency of the reference is a unit of time for switching an average output power, which has no relation with a speed of a transmit signal. For this, it is possible to form the circuit with a memory having a relatively slow access speed. As a result, the coefficient table 15 is not required to operate at a high speed.

The multiplying unit 16 multiples a signal outputted from the odd-order component calculating unit 14 by coefficient information from the coefficient table 15, and outputs an attenuation signal. As will be described later, the multiplying unit 16 comprises a plurality of portions for respective odd-order components. This function is accomplished by, for example, software.

The adding unit 17 subtracts the attenuation signal outputted from the multiplying unit 16 (a plurality of multiplying units as will be described later) from the above signal to be transmitted, and outputs a result. This function is accomplished by, for example, software.

The D/A converting unit 11 converts a digital signal outputted from the adding unit 17 into an analog signal, and outputs it.

Whereby, in the signal amplitude change processing unit 10, with respect to an inputted signal (signal to be transmitted), a power value of odd order of an amplitude quantity contained in a signal to be inputted to the amplifying unit 12 is calculated by the odd-order component calculating unit 14. In the multiplying unit 16, coefficient information is weighed on the calculated value and an attenuation signal having the inverted phase is outputted therefrom. Further, the weighed value is added to the input signal in the adding unit 17, and the input signal is outputted as a processed signal. The processed signal is inputted to the amplifying unit 12, then transmitted.

Namely, distortion components of powers of an input signal are determined in calculation, the obtained values are phase-inverted and multiplied by the coefficient information, the results are added to the input signal, then inputted to the amplifier 12. Whereby, power components of odd orders are removed from a signal to be inputted to the amplifier 12, so which the adjacent channel power contained in an output signal is decreased.

The coefficient information is determined according to an average output power which the amplifier 12 will transmit. Frequency of reference to the coefficient information is a unit of time for switching the average output power, so which the coefficient table 15 is not required to operate at a high speed.

Figure 3:
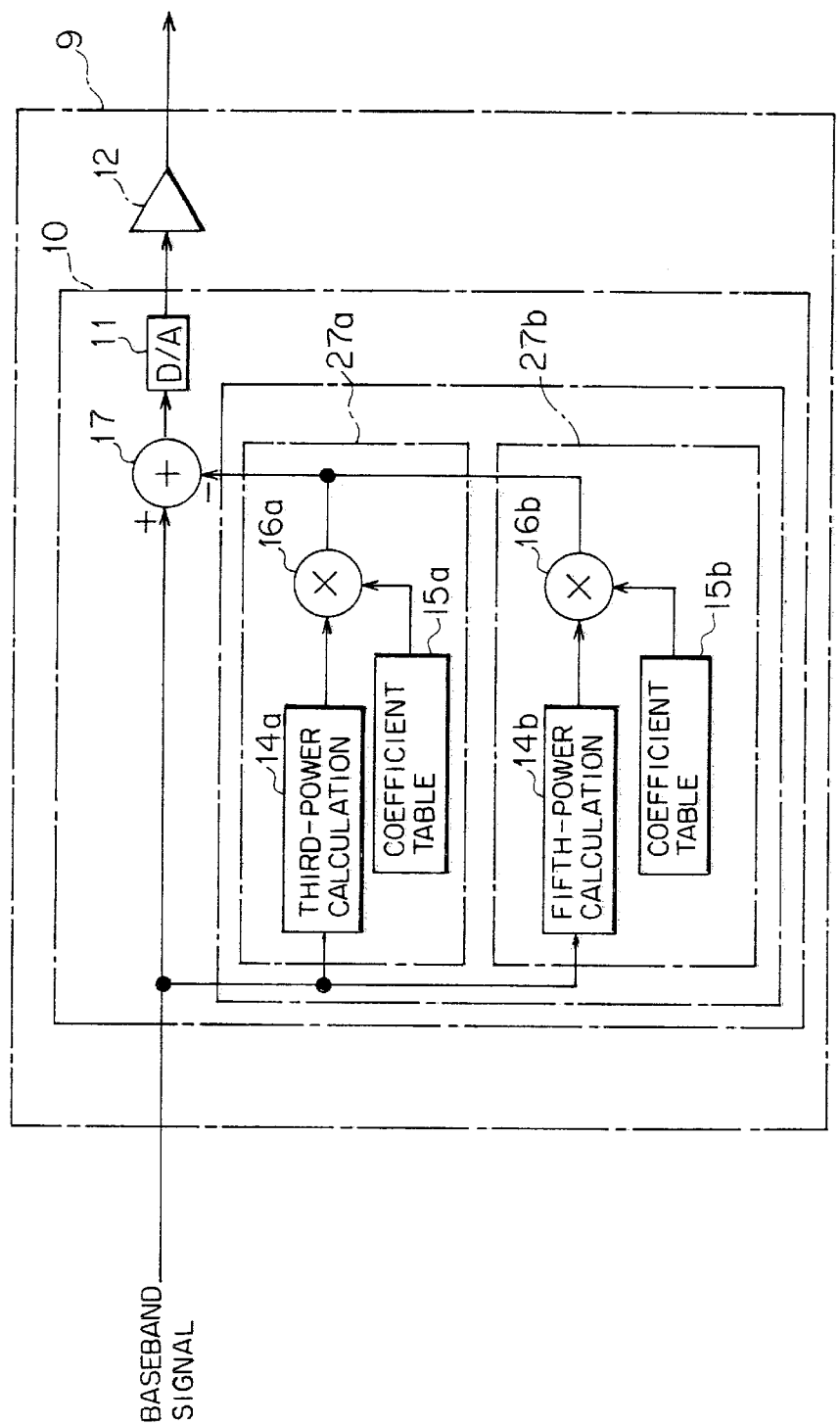
FIG. 3 is a block diagram showing in more detail the predistortion-type distortion compensation amplifying apparatus according to the first embodiment of this invention.

More details of the odd-order component calculating unit 14 are shown in FIG. 3. FIG. 3 is a block diagram showing in more detail the predistortion-type distortion compensation amplifying apparatus 9 according to the first embodiment of this invention. The odd-order component calculating unit 14 (refer to FIG. 2) comprises the third-power component calculating units 14a and 14b (refer to FIG. 3). The coefficient table 15 (refer to FIG. 2) comprises coefficient tables 15a and 15b (refer to FIG. 3). The multiplying unit 16 (refer to FIG. 2) comprises multiplying units 16a and 16b.

The adding unit 17, the D/A converting unit 11 and the amplifier 12 shown in FIG. 3 are identical to those described above, further descriptions of which are thus omitted.

A sub odd-order component calculating unit 27a extracts a power component of the third-power (third-order) component of the amplitude quantity contained in a signal to be transmitted, and outputs it. The sub odd-order component calculating unit 27a comprises the third-power component calculating unit 14a, the coefficient table 15a, and the multiplying unit 16a. The third-power component calculating unit 14a extracts a third-power component of the amplitude quantity contained in a signal to be transmitted. The coefficient table 15a can select one of plural pieces of coefficient information according to a signal from the outside, and output it. The multiplying unit 16a multiplies a signal outputted from the third-power component calculating unit 14a by coefficient information from the coefficient table 15a, and outputs an attenuation signal.

Similarly, the sub odd-order component calculating unit 27a extracts a power component of the fifth-power (fifth-order) component of the amplitude quantity included in a signal to be transmitted, and outputs it. The sub odd-order component calculating unit 27a comprises a fifth-power component calculating unit 14b, the coefficient table 15b, and the multiplying unit 16b. The fifth-power component calculating unit 14b extracts a fifth-power component of the amplitude quantity contained in a signal to be transmitted. The coefficient table 15b can select one of plural pieces of coefficient information according to a signal from the outside, and output it. The multiplying unit 16b multiplies a signal outputted from the fifth-power component calculating unit 14b by coefficient information from the coefficient table 15b, and outputs an attenuation signal.

Functions of the sub odd-order component calculating units 27a and 27b are accomplished by, for example, software. The coefficient tables 15a and 15b are substantially regions in the above coefficient table 15.

Although not shown, in the odd-order component calculating unit 14 in the signal amplitude change processing unit 10 shown in FIG. 3, it is possible to additionally provide a sub odd-order component calculating unit for the seventh power (not shown), a sub odd-order component calculating unit for the ninth power (not shown), and so on. A reason of this is to calculate a component of higher order such as the seventh power, the ninth power or the like, thereby increasing the accuracy. In such case, the sub odd-order component calculating unit for the seventh power comprises a seventh-power component calculating unit, a coefficient table for the seventh power, and a multiplying unit for the seventh power. Similarly, the sub odd-order component calculating unit for the ninth power comprises a ninth-power component calculating unit, a coefficient table for the ninth power, and a multiplying unit for the ninth power. The seventh-power component calculating unit and the ninth-power component calculating unit have the same function as which of the above third-power component calculating unit 14a, whereas the coefficient table for the seventh power and the coefficient table for the ninth power have the same function as which of the above coefficient table 15a, further descriptions of which are thus omitted. Similarly, the multiplying unit for the seventh power and the multiplying unit for the ninth power are identical to the above multiplying unit 16a, further descriptions of which are thus omitted.

Next, a flow of a signal inside the predistortion-type distortion compensation amplifying apparatus 9 will be described using Equations (7) to (11). Assuming which an amplitude function f of the amplifier 12 is expressed by Equation (7). Wherein, $M_i(t)$ is magnitude of amplitude of a modulated wave (corresponding to an amplitude quantity x of a signal to be transmitted), G is a gain of the amplifier 12, and An is coefficient information of the n-th power. Incidentally, $\Sigma\infty_{n=1}$ represents a sum of 1 to infinity with respect to n.

$$f[M_i(t)]=G(\Sigma\infty_{n=1}An \cdot M_i(t)^n) \quad (7)$$

When phase distortion is small, adjacent channel power ACP is expressed by Equation (8):

$$ACP=P_i(t) \cdot \Sigma\infty_{n=1}Bn[M_i(t)] \quad (8)$$

where, $P_i(t)$ is a signal waveform inputted to the amplifier 12, and $Bn[M_i(t)]$ is the n-th coefficient information. $Bn[M_i(t)]$ is a function of magnitude $M_i(t)$ of amplitude of an inputted modulated wave, corresponding to an amplitude quantity x of a signal to be transmitted. A value of $Bn[M_i(t)]$ can be analytically determined using An when the modulation system is determined. For example, a value of $Bn[M_i(t)]$ is determined by Formula (9) in the case of QPSK (Quadrature Phase Shift Keying or Quadri Phase Shift Keying);

$$ACP=[(3/4)A_3 x^2+(1/2)A_5 x^4 + \ldots ]P_i(t) \quad (9)$$

where $A_3$ and $A_5$ are the third-order and the fifth-order coefficient information of x. In practice, $A_3$ and $A_5$ become complex numbers including phase information since there is phase distortion. Further, these values are determined according to an average output power. In the case of the amplifier 12 having a constant output, these values are practically sufficient.

Accordingly, by beforehand subtracting this value from an input signal, it is possible to decrease the adjacent channel power. Namely, terms of the third order and the fifth order are weighed by coefficient information in the sub odd-order component calculating units 27a and 27b (refer to FIG. 3), respectively. Deformed (undergone the predistortion process) $I_{PD}$ and $Q_{PD}$ signals are expressed by Equations (10) and (11), respectively:

$$I_{PD}=\{1-(3/4)A_3 x^2 (1/2) A_5 x^4- \ldots \} \cdot I \quad (10)$$

$$Q_{PD}=\{1(3/4)A_3 x^2 (1/2) A_5 x^4- \ldots \} \cdot Q \quad (11)$$

Namley, as seen from these Equations (10) and (11), contribution of power components of odd orders of the amplitude quantity becomes small.

With the above structure, a flow of a signal inputted to the predistortion-type distortion compensation amplifying apparatus 9 is as follows.

Figure 1:
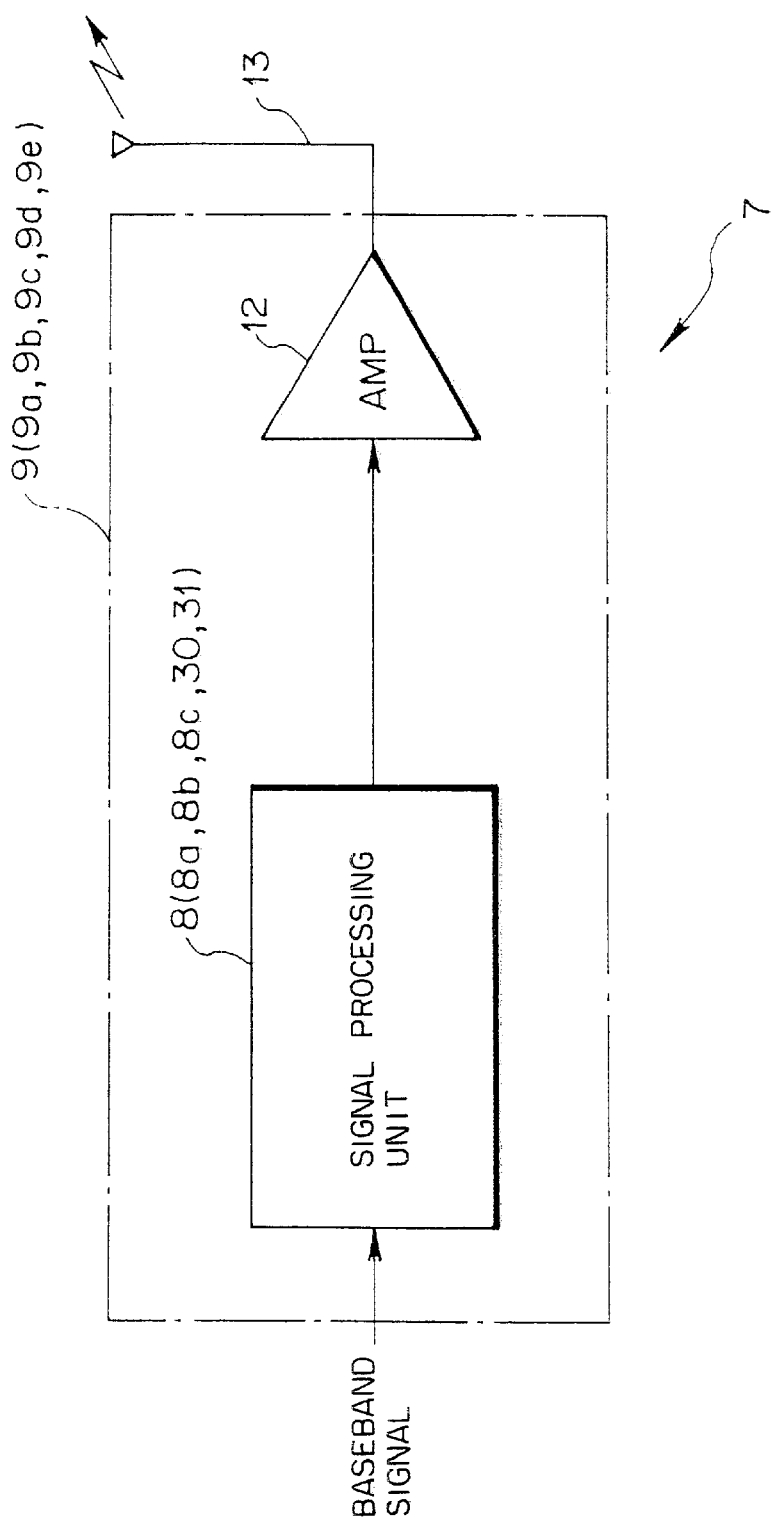
FIG. 1 is a block diagram of a predistortion-type distortion compensation amplifying apparatus in a transmitting unit of a radio transmitter to which the present invention is applied.

In the third-power component calculating unit 14a in the sub odd-order component calculating unit 27a, a third-power component $A_3 \cdot x^3$ of an amplitude quantity x contained in a signal to be transmitted is extracted. In the multiplying unit 16a, coefficient information outputted from the coefficient table 15a and a signal outputted from the third-power component calculating unit 14a are multiplied, and an attenuation signal is outputted. Similarly, in the fifth-power component calculating unit 14b in the sub odd-order component calculating unit 27b, a fifth-power component $A_5 \cdot X^5$ of the amplitude quantity x of the signal to be transmitted is extracted. In the multiplying unit 16b, coefficient information outputted from the coefficient table 15b and a signal outputted from the fifth-power component calculating unit 14b are multiplied, and an attenuation signal is outputted. In the adding unit 17, the attenuation signals outputted from the sub odd-order component calculating units 27a and 27b are subtracted from the original signal to be transmitted, whereby the signal is outputted such which contribution of the third-power and the fifth-power components becomes small. Further, in the D/A converting unit 11, a digital signal outputted from the adding unit 17 is converted into an analog signal, power-amplified in the amplifier 12, then transmitted from the antenna 13 (refer to FIG. 1).

As this, distortion components of odd powers of a signal which are a problem in a spurious signal are determined in calculation, a phase of the signal is inverted, coefficient information is multiplied and added to the input signal, then inputted to the amplifier 12, whereby the adjacent channel power of the amplifier 12 is decreased. Therefore, an external RF circuit having a linear characteristic becomes unnecessary, and the circuit scale can be decreased, which contributes to a reduction of the power consumption or allows compactness of a portable telephone or the like.

When the output power is changed, coefficient information according to an output power which is a target is referred by memories of the coefficient tables 15a and 15b, and weighed. Since frequency of the reference is a unit of time for switching the average output power, intervals to refer to the memories have no relation with a speed of the signal. It is therefore possible to form the circuit with memories having a relatively slow access speed.

(A1) Description of First Modification of First Embodiment of the Invention

The structure of the above signal processing unit 8 may be another. Hereinafter, modifications of the above signal processing unit 8 will be described in first to third modifications.

Figure 4:
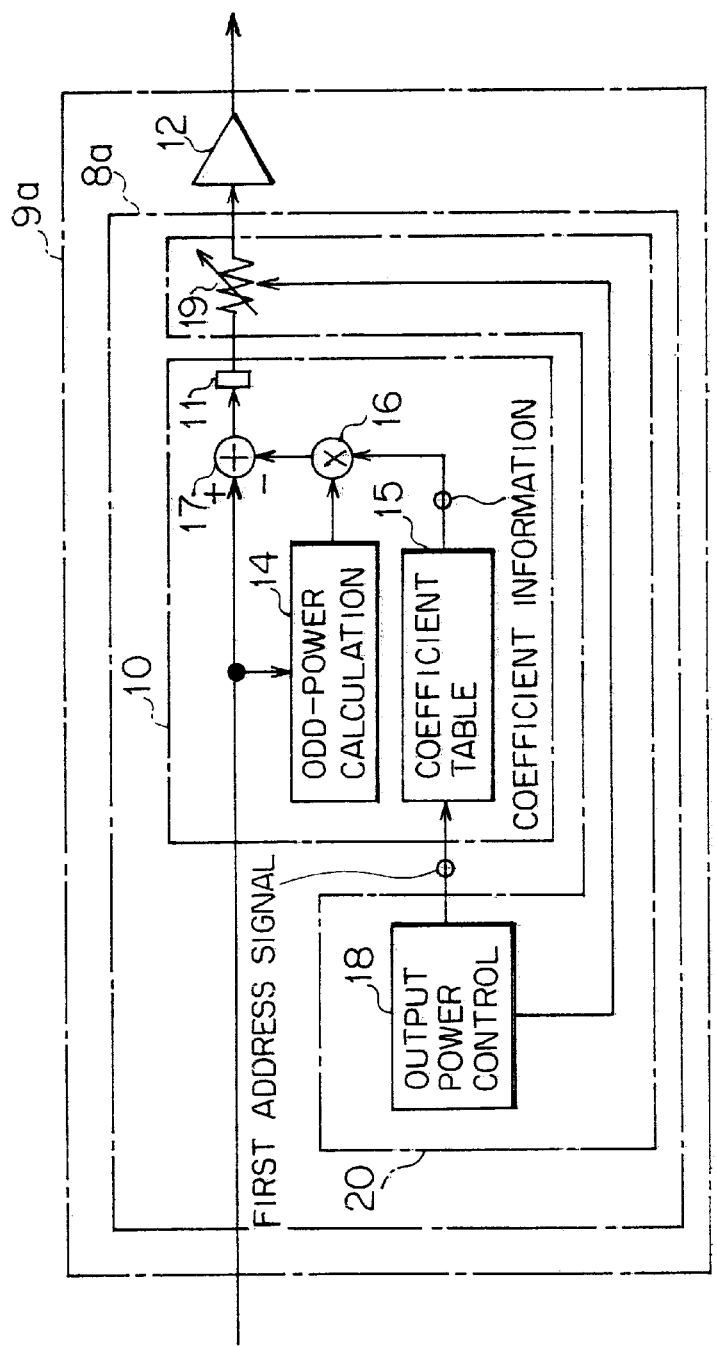
FIG. 4 is a block diagram of a predistortion-type distortion compensation amplifying apparatus according to a first modification of the first embodiment of this invention.

FIG. 4 is a block diagram of a predistortion-type distortion compensation amplifying apparatus 9a according to a first modification of the first embodiment of this invention. The predistortion-type distortion compensation amplifying apparatus 9a shown in FIG. 4 comprises a signal processing unit 8a and an amplifier 12. The signal processing unit 8a comprises a signal amplitude change processing unit 10 and a control unit 20.

The signal amplitude change processing unit 10 outputs a signal such as to decrease contribution of power components of odd orders of an amplitude quantity contained in a signal to be transmitted, as described above. The signal amplitude change processing unit 10 comprises an odd-order component calculating unit 14, a coefficient table 15, a multiplying unit 16, an adding unit 17 and a D/A converting unit 11. Components of odd orders of the amplitude quantity are extracted from a signal to be transmitted in the odd-order component calculating unit 14, signals calculated from the values are outputted, and an attenuation signal obtained by multiplying the output signals by coefficient information having an inverted phase of the output signal is outputted. Incidentally, the coefficient table 15, the multiplying unit 16, the adding unit 17 and the D/A converting unit 11 other than the odd-order component calculating unit 14 are identical to those described above, further descriptions of which are thus omitted. The amplifier 12 is also identical to which described above, further description of which is thus omitted.

The control unit 20 variably adjusts a magnitude of the processed signal and inputs it to the amplifier 12, besides being operable to input a first address signal for selecting coefficient information for power components of odd orders to the signal amplitude change processing unit 10. The control unit 20 comprises a variable attenuating unit 19 and an output power control unit 18.

The variable attenuating unit 19 can variably adjust magnitude of the processed signal by the output power control unit 18, and input it to the amplifier 12. This function is accomplished by, for example, a variable resistor.

The output power control unit 18 can control the variable attenuating unit 19, besides being operable to input the first address signal for selecting coefficient information to the signal amplitude change processing unit 10. This function is accomplished by, for example, software. The output power control unit 18 inputs the first address signal to the coefficient table 15 in the signal amplitude change processing unit 10 at an appropriate timing from a main control unit (not shown), whereby appropriate coefficient information is outputted from the coefficient table 15. Incidentally, this coefficient information is determined according to an average output power which the amplifier 12 will transmit, so which the coefficient table 15 is not required to operate at a high speed like sampling intervals.

Figure 5:
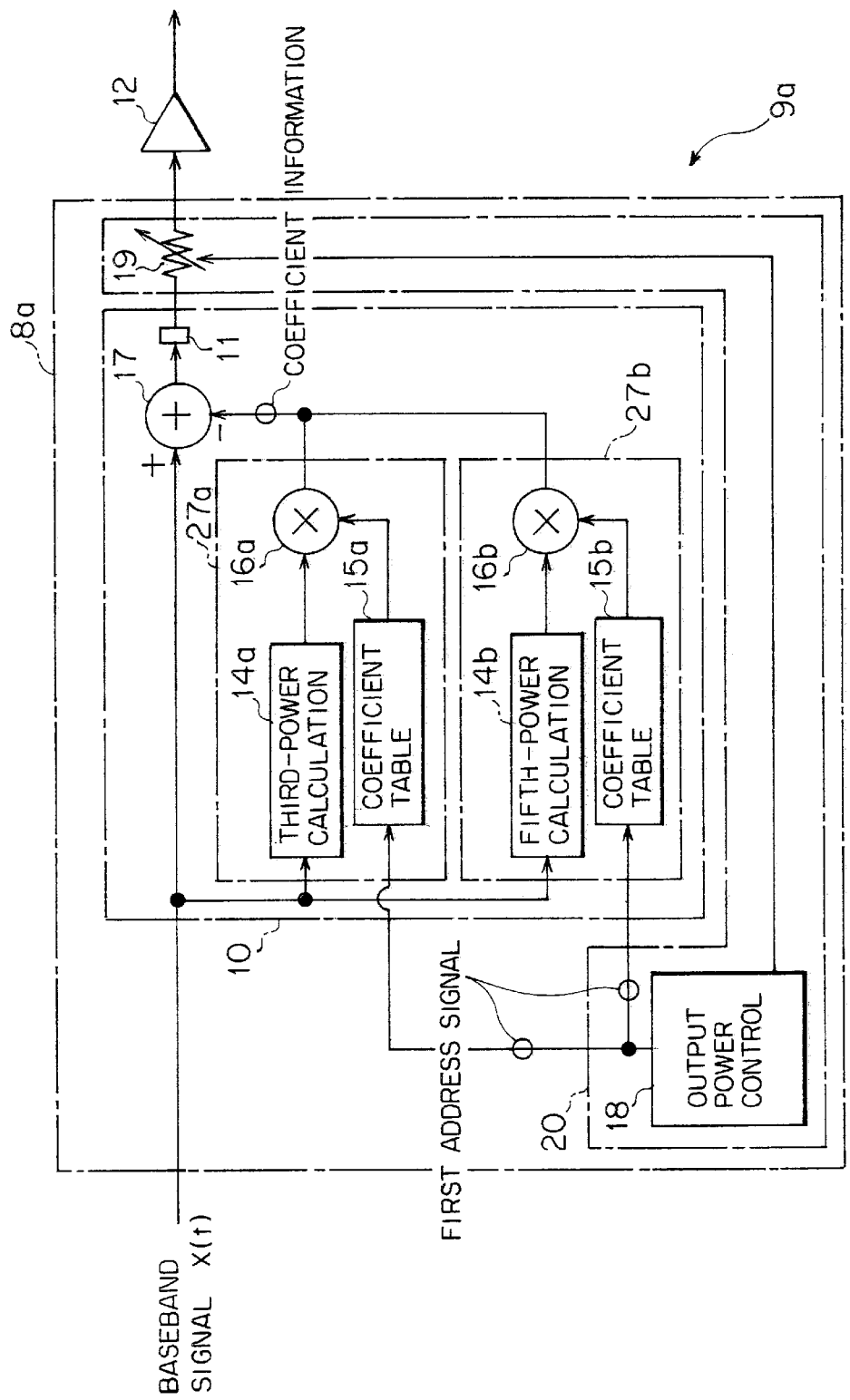
FIG. 5 is a block diagram showing in more detail the predistortion-type distortion compensation amplifying apparatus according to the first modification of the first embodiment of this invention.

The signal amplitude change processing unit 10 is shown in more detail in FIG. 5. FIG. 5 is a block diagram showing in more detail the predistortion-type distortion compensation amplifying apparatus 9a according to the first modification of the first embodiment of this invention. The predistortion-type distortion compensation amplifying apparatus 9a shown in FIG. 5 comprises the signal processing unit 8a and the amplifier 12. The signal amplitude change processing unit 10 in the signal processing unit 8a comprises sub odd-order component calculating units 27a and 27b, an adding unit 17, and a D/A converting unit 11.

The sub odd-order component calculating unit 27a comprises a third-power component calculating unit 14a, a coefficient table 15a and a multiplying unit 16a. The sub odd-order component calculating unit 27b comprises a fifth-power component calculating unit 14b, a coefficient table 15b and a multiplying unit 16b. These are identical to those described above, further descriptions of which are thus omitted.

In order to increase the accuracy by calculating a component of higher order such as the seventh power, the ninth power or the like, it is possible to additionally provide a sub odd-order component calculating unit for the seventh power (not shown), a sub odd-order component calculating unit for the ninth-power (not shown) and so on in the signal amplitude change processing unit 10 shown in FIG. 5. In such case, the sub odd-order component calculating unit for the seventh power comprises a seventh-power component calculating unit, a coefficient table for the seventh power and a multiplying unit for the seventh power, whereas the sub odd-order component calculating unit for the ninth power comprises a ninth-power component calculating unit, a coefficient table for the ninth power and a multiplying unit for the ninth power. The seventh-power component calculating unit and the ninth-power component calculating unit have the same function as which of the above third-power component calculating unit 14a, whereas the coefficient table for the seventh power and the coefficient table for the ninth power have the same function as which of the above coefficient table 15a, further descriptions of which are thus omitted. The multiplying unit for the seventh power and the multiplying unit for the ninth power are identical to the above multiplying unit 16a, further descriptions of which are thus omitted.

In FIG. 5, like reference characters designate like or corresponding parts having the same or similar functions, further descriptions of which are thus omitted.

A value of a power component of the third order of the amplitude quantity contained in a signal to be transmitted which has been inputted to the signal amplitude change processing unit 10 is calculated by the third-power component calculating unit 14a in the sub odd-order component calculating unit 27a, and a signal obtained by multiplying the calculated value by coefficient information is outputted from the multiplying unit 16a. Similarly, a value of a power component of the fifth order the amplitude quantity contained in the signal is calculated by the fifth-power component calculating unit 14b in the sub odd-order component calculating unit 27b, and a signal obtained by multiplying the calculated value by coefficient information is outputted from the multiplying unit 16b. Weighted signals outputted from the multiplying units 16a and 16b and the input signal are added in the adding unit 17, and outputted as a processed signal. The processed signal is converted from digital to analog in the D/A converting unit 11. The signal is then adjusted to appropriate magnitude in the variable attenuating unit 19 in the control unit 20, inputted to the amplifying unit 12, then transmitted from the antenna 13 (refer to FIG. 1).

With the above structure, contribution of power components of odd orders of the amplitude quantity contained in a signal to be transmitted is decreased, and magnitude of the output power at the amplifier 12 is controlled. Namely, distortion power components of a signal to be transmitted are determined in calculation, and signals obtained by multiplying the components by coefficient information having the inverse phase are subtracted from an input signal.

Magnitude of the output power is adjusted by a control signal outputted from the output power control unit 18 according to an instruction from a main control unit (not shown). The processed signal is adjusted to appropriated magnitude in the variable attenuating unit 19, and inputted to the amplifier 12. When the magnitude of the output power is changed, coefficient information according to an output power which is a target is referred by the coefficient table 15 (or 15a, or 15b), and weighed.

As this, the adjacent channel power which is a problem in a spurious signal is decreased. Accordingly, an external RF circuit having a linear characteristic becomes unnecessary, and the circuit scale can be decreased. It is therefore possible to contribute to a reduction of the power consumption, and allows compactness of a portable telephone or the like. Since frequency of reference to the coefficient table 15 (or 15a, or 15b) is a unit of time for switching the average output power, it is possible to form the circuit with a memory having a relatively slow access speed.

(A2) Description of Second Modification of First Embodiment of the Invention

Figure 6:
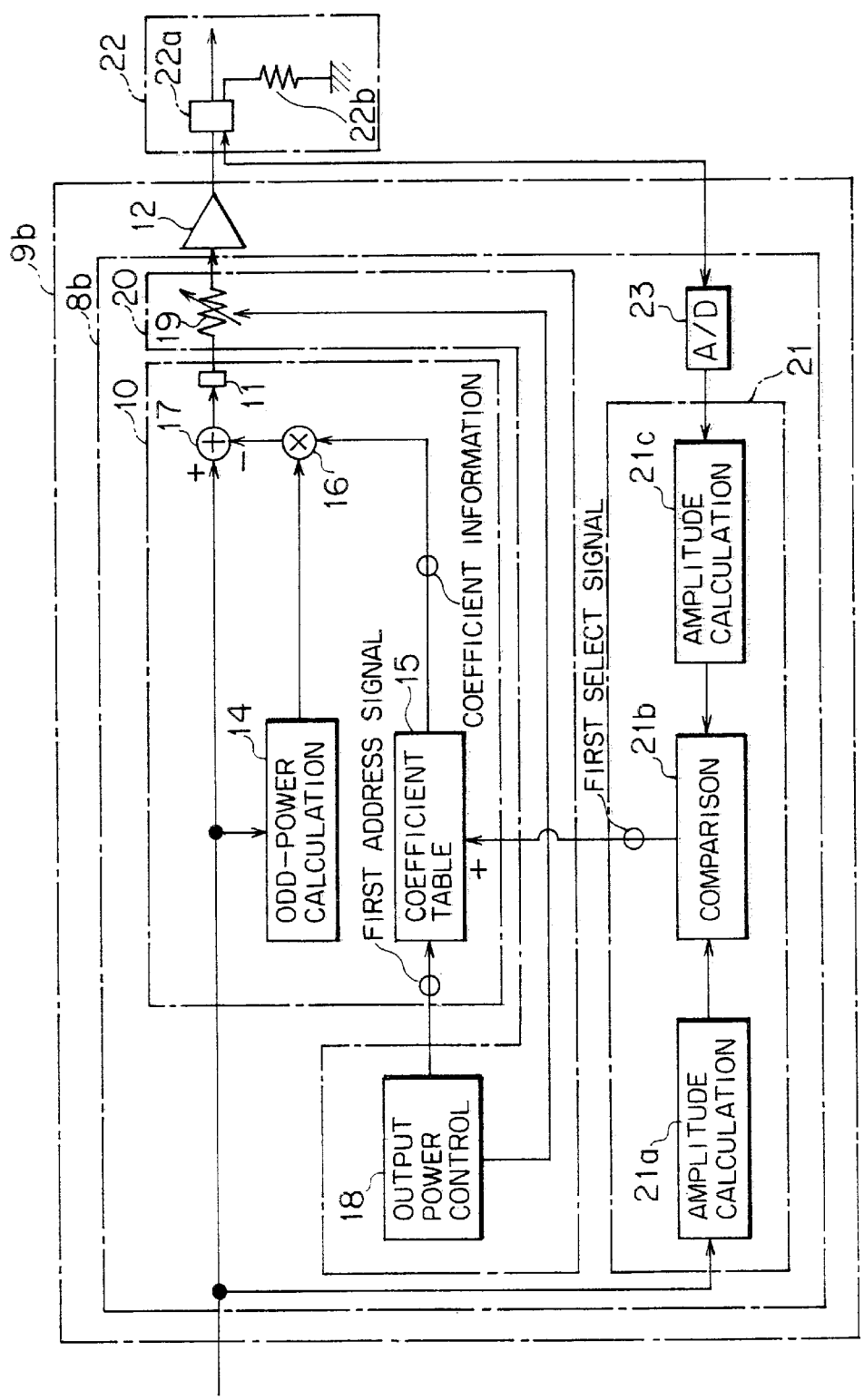
FIG. 6 is a block diagram of a predistortion-type distortion compensation amplifying apparatus according to a second modification of the first embodiment of this invention.

FIG. 6 is a block diagram of a predistortion-type distortion compensation amplifying apparatus 9b according to a second modification of the first embodiment of this invention. The predistortion-type distortion compensation amplifying apparatus 9b shown in FIG. 6 comprises a signal processing unit 8b and an amplifier 12. A detecting unit 22 is disposed on the output's side of the amplifier 12. The signal processing unit 8b comprises a signal amplitude change processing unit 10 and a control unit 20, along with an amplitude information comparing unit 21 and an A/D converter 23.

The signal amplitude change processing unit 10 outputs a processed signal such as to decrease contribution of power components of odd orders of an amplitude quantity contained in a signal to be transmitted, as stated above. The signal amplitude change processing unit 10 comprises an odd-order component calculating unit 14, a coefficient table 15, a multiplying unit 16, an adding unit 17 and a D/A converting unit 11. These are identical to those described above, further descriptions of which are thus omitted. Components of odd orders of the amplitude quantity are extracted from a signal to be transmitted in the odd-order component calculating unit 14, signals calculated from the values are outputted, then an attenuation signal obtained by multiplying coefficient information having an inverted phase of the output signal is outputted.

The control unit 20 can variably adjust magnitude of the processed signal and input it to the amplifier 12, besides being operable to input a first address signal for selecting coefficient information for power components of odd orders to the signal amplitude change processing unit 10, as stated above. The control unit 20 comprises a variable attenuating unit 19 and an output power control unit 18. These functions are identical to those described above, further descriptions of which are thus omitted. The output power control unit 18 inputs the first address signal at an appropriate timing from a main control unit (not shown) to the coefficient table 15 in the signal amplitude change processing unit 10, whereby appropriate coefficient information is outputted from the coefficient table 15. Incidentally, the coefficient information is determined according to an average output power which the amplifier 12 will transmit. The coefficient table 15 is not necessarily required to operate at a high speed.

The A/D converter 23 converts an analog signal to a digital signal.

The amplitude information comparing unit 21 can input a first select signal generated based on a signal to be transmitted and a signal outputted from the amplifier 12 to the signal amplitude change processing unit 10. The amplitude information comparing unit 21 comprises an input amplitude calculating unit 21a, an output amplitude calculating unit 21c and a comparing-rewriting unit 21b.

The input amplitude calculating unit 21a extracts an amplitude quantity from a signal to be transmitted, and outputs input amplitude information. The output amplitude calculating unit 21c extracts an amplitude quantity from a signal outputted from the amplifier 12, and outputs output amplitude information.

The comparing-rewriting unit 21b can input the first select signal to the signal amplitude change processing unit 10 according to an error between the output amplitude information and the input amplitude information. When the input amplitude information is smaller than the output amplitude information, the comparing-rewriting unit 21b inputs the first select signal to the signal amplitude change processing unit 10 in order to rewrite the coefficient information in the coefficient table 15 such which the coefficient information becomes larger. When the input amplitude information is larger than the output amplitude information, the comparing-rewriting unit 21b inputs the first select signal to the signal amplitude change processing unit 10 in order to rewrite the coefficient information in the coefficient table 15 such which the coefficient information becomes smaller. Whereby, an error of the memory is corrected.

The detecting unit 22 monitors magnitude of an output signal of the amplifier 12, decreasing a gain of the signal amplified by the amplifier 12 and outputting it. This function is accomplished using a directional coupler 22a. The directional coupler 22a can drop a gain of the signal amplified by the amplifier 12 by, for example, about 20 dB, and output it. To the directional coupler 22a, an output terminator 22b of 50 Ω is connected. Although the detecting unit 22 uses the directional coupler 22a, the present invention is not limited to this example, but another detecting method may be employed.

A signal outputted from the detecting unit 22 is converted from analog to digital in the A/D converter 23, inputted to the output amplitude calculating unit 21c, at which magnitude of the output signal is monitored. Namely, a part of the input signal is branched, a part of the output of the amplifier 12 is branched, then the part of the input and the part of the output are compared in the comparing-rewriting unit 21b. When an error between them is large, the first select signal is outputted, whereby the coefficient table 15 is rewritten. It is thereby possible to cope with a change in characteristics of the amplifier 12 due to a change in temperature or a change with time. Object here is to correct an error of the memory, a longer time interval than a sampling time for the signal suffices to access to the coefficient table 15.

Figure 7:
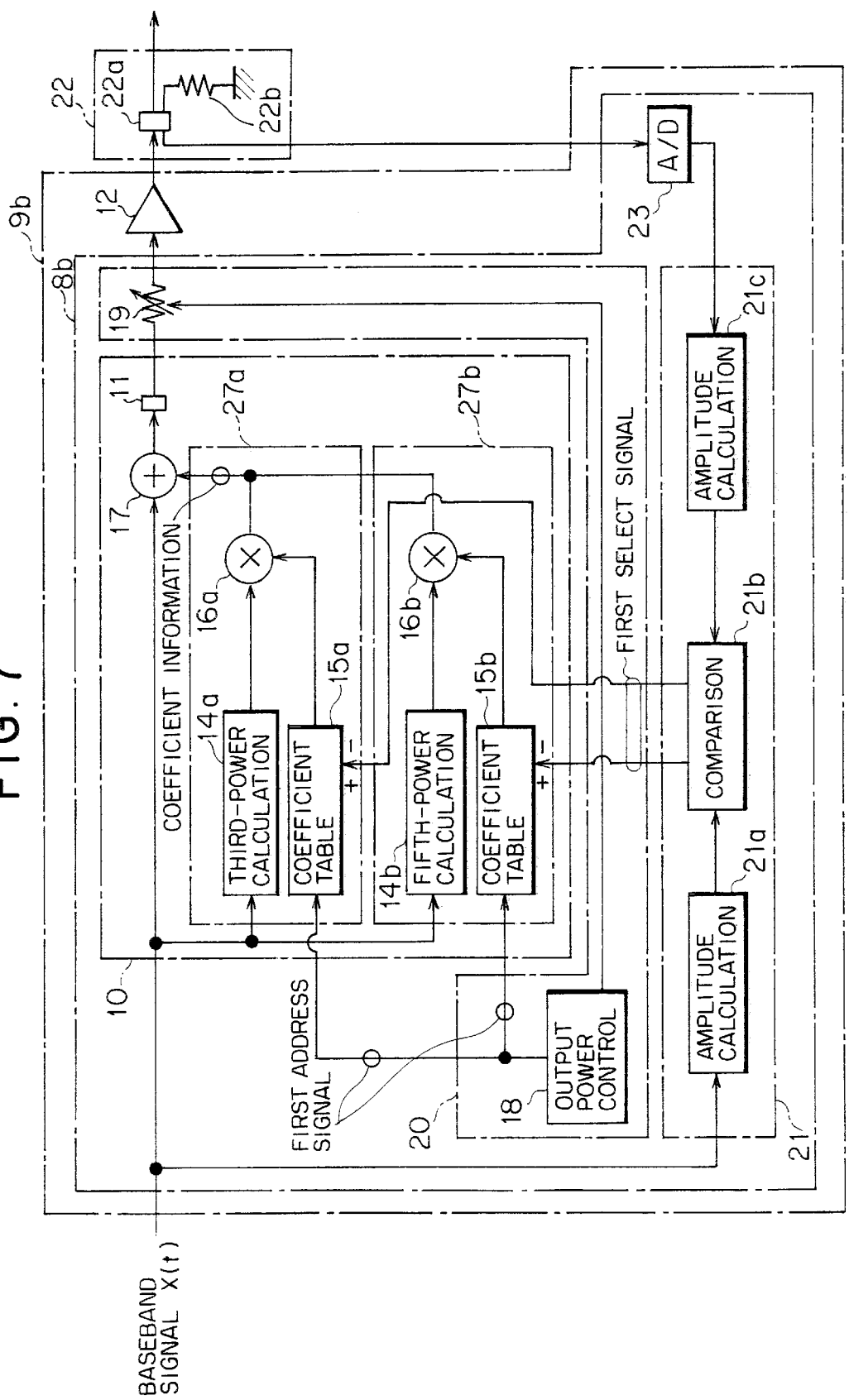
FIG. 7 is a block diagram showing in more detail the predistortion-type distortion compensation amplifying apparatus according to the second modification of the first embodiment of this invention.

The signal amplitude change processing unit 10 is shown in more detail in FIG. 7. FIG. 7 is a block diagram showing in more detail the predistortion-type distortion compensation amplifying apparatus 9b according to the second modification of the first embodiment of this invention. The signal amplitude change processing unit 10 in the signal processing unit 8b comprises sub odd-order component calculating units 27a and 27b along with the adding unit 17 and the D/A converting unit 11.

The sub odd-order component calculating unit 27a comprises a third-power component calculating unit 14a, a coefficient table 15a and a multiplying unit 16a. The sub odd-order component calculating unit 27b comprises a fifth-power component calculating unit 14b, a coefficient table 15b and a multiplying unit 16b. These are identical to those described above, further descriptions of which are thus omitted.

In order to increase the accuracy by calculating a component of higher order such as the seventh power, the ninth power, or the like, the signal amplitude change processing unit 10 shown in FIG. 7 may additionally have a sub odd-order component calculating unit for the seventh power (not shown), a sub odd-order component calculating unit for the ninth power (not shown), and so on. In such case, the sub odd-order component calculating unit for the seventh power comprises a seventh-power component calculating unit, a coefficient table for the seventh power and a multiplying unit for the seventh power, whereas the sub odd-order component calculating unit for the ninth power comprises a ninth-power component calculating unit, a coefficient table for the ninth power and a multiplying unit for the ninth power. The seventh-power component calculating unit and the ninth-power component calculating unit have the same function as which of the above third-power component calculating unit 14a, whereas the coefficient table for the seventh power and the coefficient table for the ninth power have the same function as which of the above coefficient table 15a, further descriptions of which are thus omitted. The multiplying unit for the seventh power and the multiplying unit for the ninth power are identical to the above multiplying unit 16a, further descriptions of which are thus omitted.

In FIG. 7, like reference characters designate parts being identical to or having identical functions to those described above, further descriptions of which are thus omitted.

In the signal amplitude change processing unit 10, values of the third power and the fifth power of an amplitude quantity contained in a transmit signal to be inputted to the amplifier 12 are calculated, and the calculated values are multiplied by coefficient information, thus weighed. The weighed values are added to an input signal in the adding unit 17, whereby a processed signal is obtained. In the variable attenuating unit 19 in the control unit 20, the processed signal is attenuated, inputted to the amplifier 12, and transmitted.

In the output amplitude calculating unit 21c, magnitude of an amplitude quantity of an output signal from the amplifier 12 is calculated, and output amplitude information is outputted. In the input amplitude calculating unit 21a, magnitude of an amplitude quantity of a signal to be transmitted is extracted, and input amplitude information is outputted. In the comparing-rewriting unit 21b, the output amplitude information and the input amplitude information are compared. When the input amplitude information is smaller than the output amplitude information, the comparing-rewriting unit 21b inputs a first select signal according to an error between the output amplitude information and the input amplitude information in order to rewrite the coefficient information in the coefficient table 15 (or 15a, or 15b) in the signal amplitude change processing unit 10 such which the coefficient information becomes larger. When the input amplitude information is larger than the output amplitude information, the comparing-rewriting unit 21b inputs the first select signal in order to rewrite the coefficient information in the coefficient table 15 (or 15a, or 15b) in the signal amplitude change processing unit 10 such which the coefficient information becomes smaller. As shown in FIG. 7, the first select signal is inputted to the coefficient tables 15a and 15b for respective orders.

With the above structure, distortion components of odd powers of a signal are determined in calculation, a phase of the components is inverted, coefficient information is multiplied, results are added to an input signal, and the input signal is inputted to the amplifier 12. Whereby, contribution of power components of odd orders of the amplitude quantity contained in a signal to be transmitted is decreased.

On the other hand, magnitude of an output power in the amplifier 12 is controlled. The magnitude of the output power is adjusted by a control signal outputted from the output power control unit 18 according to an instruction from a main control unit (not shown). Namely, the processed signal is adjusted to appropriate magnitude in the variable attenuating unit 19, and inputted to the amplifier 12. And the more, when the magnitude of the output power is changed, coefficient information according to an output power which is a target is referred by the coefficient table 15 (or 15a, or 15b), and weighed.

A part of the input and a part of the output of the amplifier 12 are compared. The coefficient table 15 (or 15a, or 15b) is such rewritten which the coefficient information becomes larger when the input is smaller, or which the coefficient information becomes smaller when the input is larger. A value to be outputted is thereby corrected.

As this, the adjacent channel power which is a problem in a spurious signal is decreased in the transmit channel. Further, it becomes possible to form a distortion compensation circuit which does not require an external RF circuit, which contributes to a reduction of the power consumption and allows compactness of a portable telephone or the like.

By comparing magnitudes of the amplitude quantities of the input and output signals, an error of the memory is corrected, so which an access to the coefficient table 15 (or 15a, or 15b) is at a longer interval than the sampling time for the signal. It is thus possible to form the circuit with a memory having a relatively slow access speed.

(A3) Description of Third Modification of First Embodiment of the Invention

Figure 8:
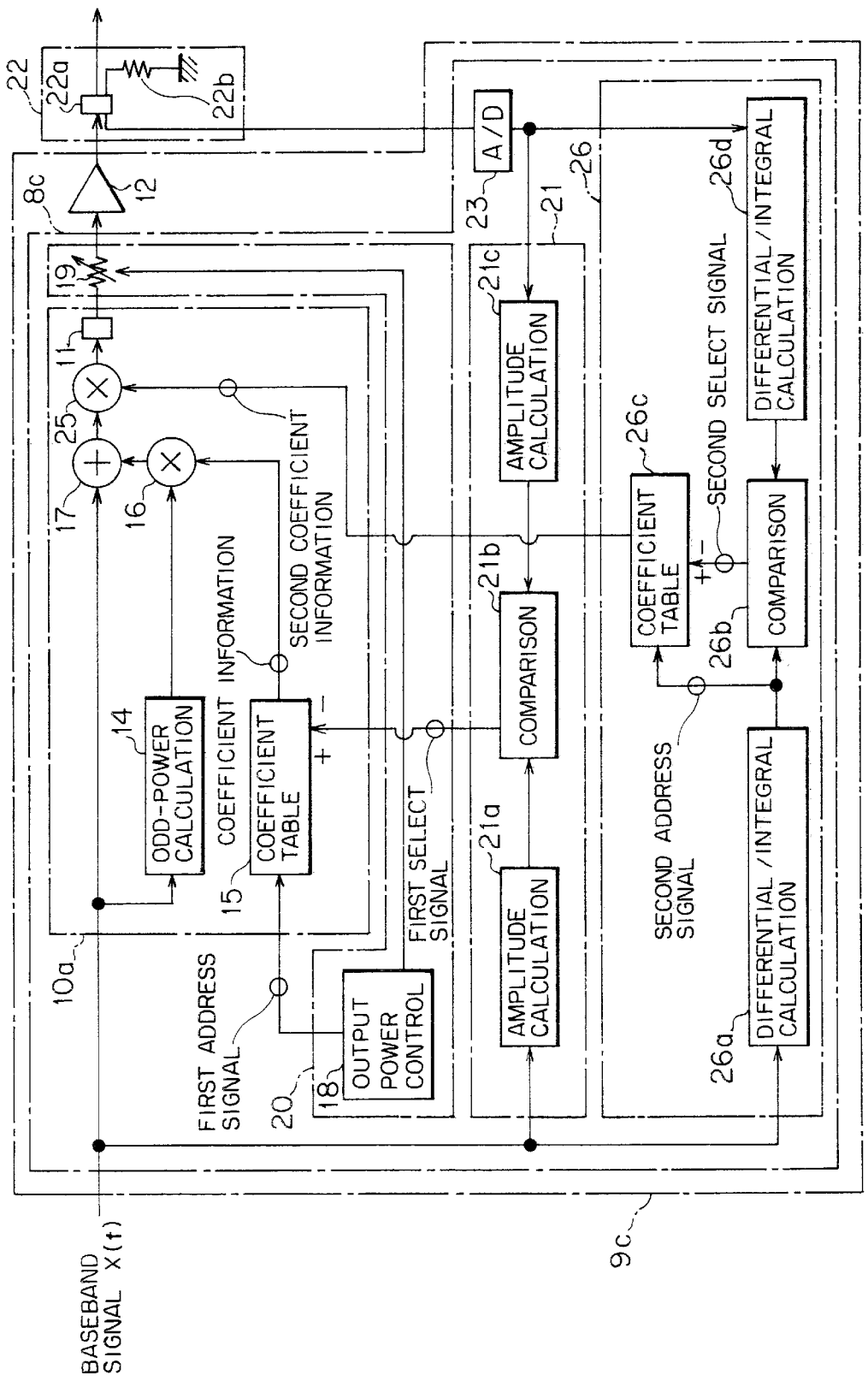
FIG. 8 is a block diagram of a predistortion-type distortion compensation amplifying apparatus according to a third modification of the first embodiment of this invention.

FIG. 8 is a block diagram of a predistortion-type distortion compensation amplifying apparatus 9c shown in FIG. 8 according to a third modification of the first embodiment of this invention. The predistortion-type distortion compensation amplifying apparatus 9c comprises a signal processing unit 8c and an amplifier 12. A detecting unit 22 is provided on the output's side of the amplifier 12. The signal processing unit 8c comprises a signal amplitude change processing unit 10a, a control unit 20, an amplitude information comparing unit 21, a differential/integral coefficient information adding unit 26 and an A/D converter 23.

The signal amplitude change processing unit 10a can output a processed signal such which contribution of power components of odd orders of an amplitude quantity contained in a signal to be transmitted is decreased. The signal amplitude change processing unit 10a comprises an odd-order component calculating unit 14, a coefficient table 15, a multiplying unit 16, an adding unit 17, and a D/A converting unit 11. The signal amplitude change processing unit 10a additionally comprises a multiplying unit 25 disposed on the output's side of the adding unit 17. The multiplying unit 25 multiplies a signal outputted from the adding unit 17 by second coefficient information outputted from the differential/integral coefficient information adding unit 26, and outputs a result as a processed signal. The odd-numbered degree component calculating unit 14 is shown in more detail in FIG. 9.

Figure 9:
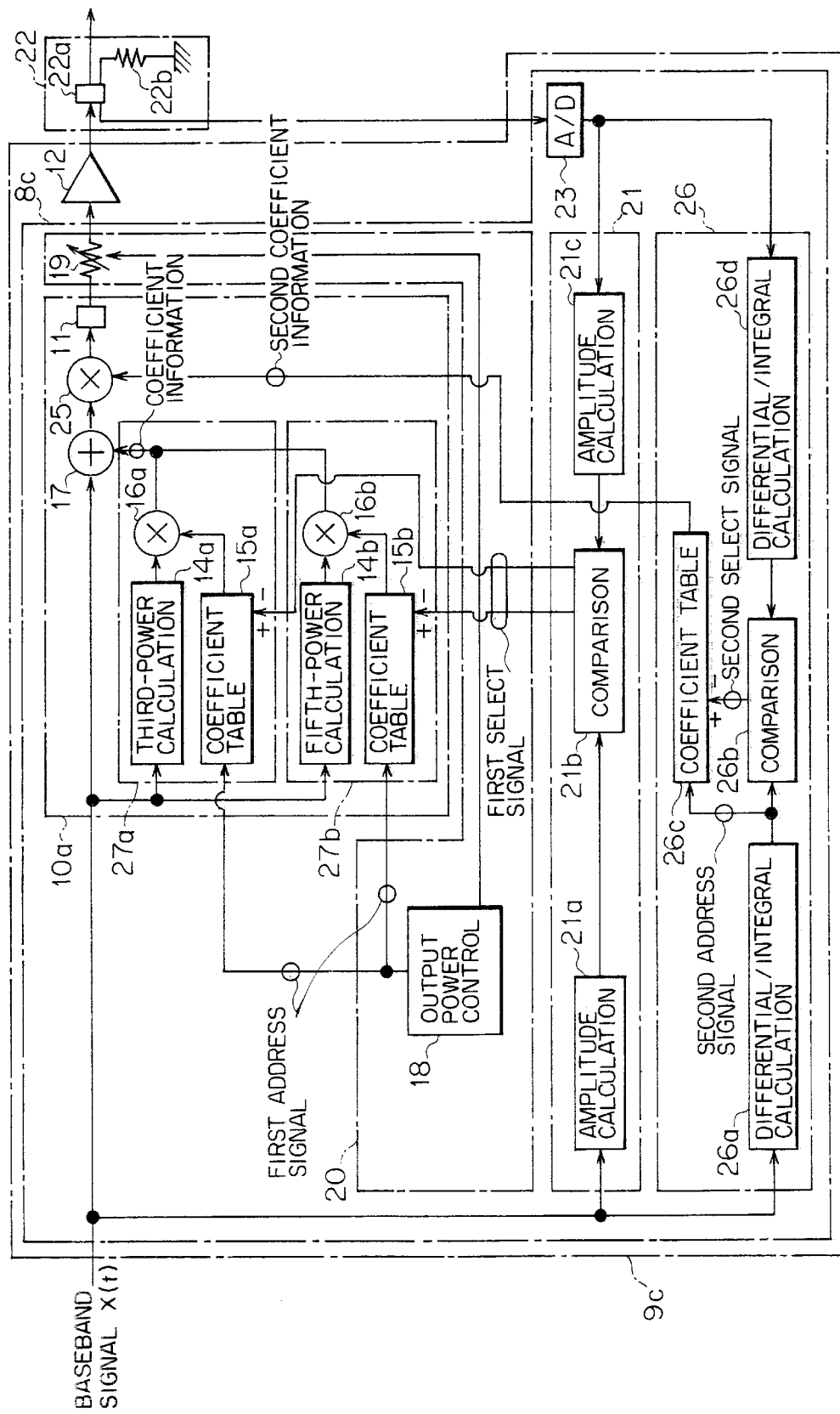
FIG. 9 is a block diagram showing in more detail the predistortion-type distortion compensation amplifying apparatus according to the third modification of the first embodiment of this invention.

FIG. 9 is a block diagram showing in more detail the predistortion-type distortion compensation amplifying apparatus 9c according to the third modification of the first embodiment of this invention. The signal processing unit 10a shown in FIG. 9 comprises sub odd-order component calculating units 27a and 27b, along with the adding unit 17, the D/A converting unit 11 and the multiplying unit 25. The adding unit 17, the D/A converter 11 and the multiplying unit 25 are identical to those described above, further descriptions of which are thus omitted.

In order to increase the accuracy of the operation, the signal amplitude change processing unit 10a may additionally comprise a sub odd-order component calculating unit for the seventh power (not shown), and a sub odd-order component calculating unit for the ninth power (not shown). In such case, the sub odd-order component calculating unit for the seventh power comprises a seventh-power component calculating unit, a coefficient table for the seventh power and a multiplying unit for the seventh power, whereas the sub odd-order component calculating unit for the ninth power comprises a ninth-power component calculating unit, a coefficient table for the ninth power and a multiplying unit for the ninth power. The seventh-power component calculating unit and the ninth-power component calculating unit have the same function as which of the above third-power component calculating unit 14a, whereas the coefficient table for the seventh power and the coefficient table for the ninth power have the same function as which of the above coefficient table 15a, further descriptions of which are thus omitted. The multiplying unit for the seventh power and the multiplying unit for the ninth power are identical to the above multiplying unit 16a, further descriptions of which are thus omitted.

Namely, in the signal amplitude change processing unit 10a, a signal outputted from the third-order component calculating unit 14a is multiplied by coefficient information having the inverted phase in the multiplying unit 16a, whereas a signal outputted from the fifth-order component calculating unit 14b is multiplied by coefficient information having the inverted phase in the multiplying unit 16b. Outputs from the multipliers 16a and 16b are operated in the adding unit 17 of the signal amplitude change processing unit 10a, and an attenuation signal is outputted. The attenuation signal is multiplied by the second coefficient information inputted from the differential/integral coefficient information adding unit 26, and a processed signal is outputted.

On the other hand, the differential/integral coefficient information adding unit 26 can calculate first differential/integral information based on an amplitude quantity of a signal to be transmitted, calculate second differential/integral information based on an amplitude quantity of a signal outputted from the amplifier 12, and input the second coefficient information obtained based on the above first differential/integral information and the above second differential/integral information to the signal amplitude change processing unit 10a.

The differential/integral information is a differential coefficient such as a difference value in magnitude of amplitude quantities of signals, an integral value of an amplitude quantity of a signal within a constant time, a combination thereof, or the like.

The second coefficient information signifies coefficient information outputted from the differential/integral information adding unit 26, which can be used to compensate the frequency characteristic in the vicinity of a high frequency in a bias circuit (not shown) of the amplifier 12, or a bias circuit (not shown) in the power circuit, or the matching circuit. Incidentally, the second coefficient information is discriminated from coefficient information outputted from the above coefficient table 15 (or 15a, or 15b). The above is the same in the following description.

The differential/integral information adding unit 26 comprises a first differential/integral information calculating unit 26a, a second differential/integral information calculating unit 26d, a second coefficient table (second coefficient information outputting unit) 26c, and a second comparing-rewriting unit 26b.

The first differential/integral information calculating unit 26a can calculate first differential/integral information based on an amplitude quantity of a signal to be transmitted and output it, besides being operable to input a second address signal obtained based on the amplitude quantity of the signal to be transmitted to the second coefficient table 26c. The second differential/integral information calculating unit 26d calculates second differential/integral information based on an amplitude quantity of a signal outputted from the amplifier 12, and outputs it.

The second coefficient table 26c can select one of plural pieces of coefficient information according to the second address signal, and output it as second coefficient information to the signal amplitude change processing unit 10a.

The second comparing-rewriting unit 26b rewrites the second coefficient information according to an error between the above first differential/integral information and the above second differential/integral information. The second comparing-rewriting unit 26b compares first differential/integral information with second differential/integral information, and rewrites the second coefficient information such which the error therebetween becomes smaller. For example, from signals which are a part of a signal to be transmitted and a part of an output signal of the amplifier 12, absolute values of positive and negative differential coefficients of the second power of amplitude quantities of these signals are calculated, and the second coefficient information is rewritten such which an error therebetween is nullified. Incidentally, as this rewriting method, other than the above may be employed.

A differential coefficient or an integral coefficient of magnitude of an amplitude quantity of an input signal is calculated in the first differential/integral information calculating unit 26a in the differential/integral information adding unit 26. The second coefficient information determined from the magnitude of the differential coefficient or the integral coefficient is inputted from the second coefficient table 26c to the multiplier 25 in the signal amplitude change processing unit 10a. In the multiplying unit 25, an attenuation signal at the output of the adding unit 17 and the second coefficient information are multiplied, and outputted as a processed signal. The processed signal can be used to compensate a frequency characteristic in the vicinity of a high frequency in a bias circuit (not shown) of the amplifier 12, a bias circuit (not shown) in the power circuit, or the matching circuit.

In FIGS. 8 and 9, like reference characters designate parts having the same or similar functions described above, further descriptions of which are thus omitted.

In the signal amplitude change processing unit 10a, power values of odd orders of an amplitude quantity contained in a transmit signal to be inputted to the amplifier 12 are calculated, and the calculated values are multiplied by coefficient information, thus weighed. The weighed values are added to an input signal, then the input signal is outputted as a processed signal from the adding unit 17. In the variable attenuating unit 19 in the control unit 20, the processed signal is attenuated, inputted to the amplifier 12, and transmitted.

The output power control unit 18 inputs a first address signal to the coefficient tables 15a and 15b in the signal amplitude change processing unit 10a at an appropriate timing from a main control unit (not shown), whereby appropriate coefficient information is outputted from the coefficient tables 15a and 15b. The coefficient information is determined according to an average output power which the amplifier 12 will transmit. The coefficient tables 15a and 15b are not necessarily required to operate at a high speed.

A part of the input which has been branched is inputted to the first differential/integral information calculating unit 26a. The second coefficient information derived from the calculated value is inputted from the second coefficient table 26c to the signal amplitude change processing unit 10a. In the multiplying unit 25, a processed signal from the adding unit 17 and the second coefficient information are multiplied, and a result of it is outputted through the D/A converting unit 11. The result is adjusted to appropriate magnitude in the variable attenuating unit 19, inputted to the amplifier 12, and transmitted from the antenna 13 (refer to FIG. 1).

On the other hand, the gain of a part of an output signal of the amplifier 12 is decreased in the detecting unit 22, and the part of the output signal is inputted to the amplitude information comparing unit 21 and the differential/integral coefficient information adding unit 26 via the A/D converting unit 23. In the amplitude information comparing unit 21, a part of the input and apart of the output are compared.

When an error between them is large, coefficient information in the coefficient tables 15a and 15b are rewritten.

In the differential/integral coefficient information adding unit 26, absolute values of positive and negative differential coefficients of the second power are calculated from a part of the input and a part of the output of the amplifier 12. The second coefficient information in the second coefficient table 26c is such rewritten which a difference between them is nullified.

With the above structure, contribution of power components of odd orders of an amplitude quantity contained in a signal to be transmitted is decreased, and magnitude of an output power in the amplifier 12 is controlled. Namely, distortion components of powers of a signal to be transmitted are determined in calculation, and signals obtained by multiplying coefficient information having the inverted phase are subtracted from an input signal. The subtracted value is corrected according to an error detected from the input signal and an output signal, then inputted to the amplifier 12.

The output power is adjusted to appropriate magnitude by a control signal outputted from the output power control unit 18 according to an instruction from a main control unit (not shown), and inputted to the amplifier 12. When the output power is changed, coefficient information according to an output power which is a target is referred by the coefficient tables 15a and 15b, and weighed.

Further, a part of the input and a part of the output of the amplifier 12 are compared. Values outputted from the coefficient tables 15a and 15b are such corrected which the coefficient information becomes larger when the input is smaller, or which the coefficient information becomes smaller when the input is larger.

As above, the adjacent channel power of the transmit channel which is a problem in a spurious signal is decreased. Additionally, it becomes possible to form a distortion compensation circuit which does not require an external RF circuit, which contributes to a reduction of the power consumption, and allows compactness of a portable telephone or the like.

Since the coefficient tables 15a and 15b, and the second coefficient table 26c are rewritten as above and an error of the memory is thereby corrected, it is possible to cope with a change in characteristics of the amplifier 12 due to a change in temperature or a change with time. Since a longer time interval than a sampling time for a signal suffices to access to the coefficient tables 15a and 15b, and the second coefficient table 26c, it is possible to form the circuit with a memory having a relatively slow access speed.

The differential/integral coefficient information adding unit 26 compares a value obtained by using a differential value, an integral value, or the both values of an input signal with a value obtained by using a differential value, an integral value, or the both values of an output signal, and such rewrites the second coefficient table 26c which an error therebetween becomes smaller. It is thereby possible to cope with a change in characteristics of the amplifier 12 due to a change in temperature or a change with time.

The frequency characteristic in the vicinity of a high frequency of a bias circuit (not shown) of the amplifier 12, a bias circuit (not shown) of the power circuit or the matching circuit is compensated as above, so which the accuracy is improved. Additionally, it is possible to cope with a change in characteristics of the amplifier 12 due to a change in temperature or a change with time.

(B) Description of Second Embodiment of the Invention

Figure 10:
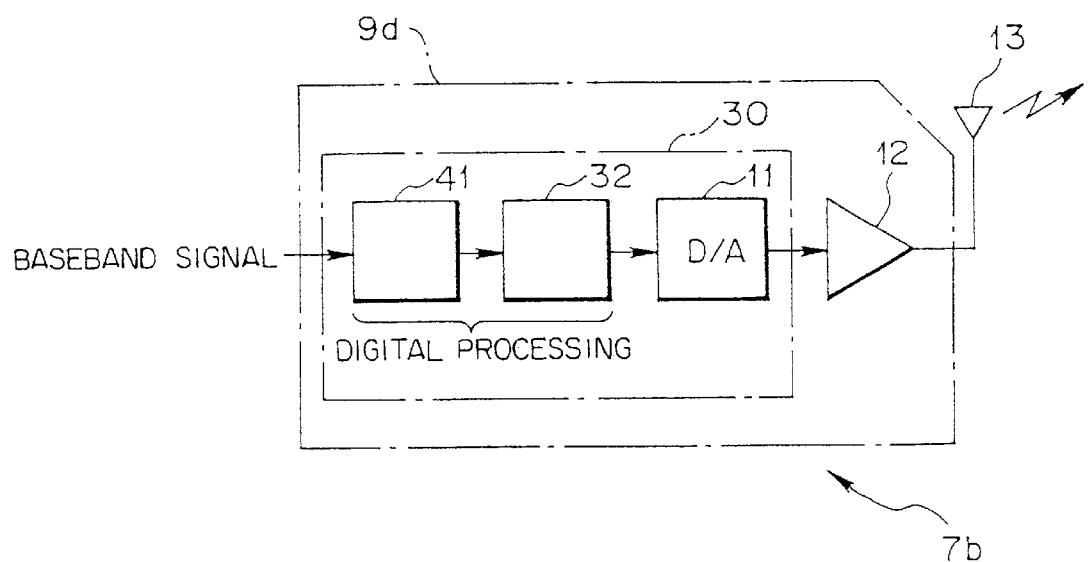
FIG. 10 is a block diagram showing a transmitting unit of a radio transmitter to which a predistortion-type distortion compensation amplifying apparatus according to a second embodiment of this invention is applied.

FIG. 10 is a block diagram showing a transmitting unit of a radio transmitter to which a predistortion-type distortion compensation amplifying apparatus according to a second embodiment of this invention is applied. A radio transmitter 7b shown in FIG. 10 comprises a predistortion-type distortion compensation amplifying apparatus 9d and an antenna 13.

The predistortion-type distortion compensation amplifying apparatus 9d comprises a signal processing unit 30 and an amplifier 12. The signal processing unit 30 performs a process with a function representing a reverse characteristic of an input-output characteristic of the amplifier 12 on a signal to be transmitted, performs a coefficient changing process, whereby an odd-order component appears in an output signal of the amplifier 12. The amplifier 12 thus operates in a non-saturation region. Here, "the amplifier 12 operates in a non-saturation region" signifies which the amplifier 12 operates in a range of a non-saturation region of the input-output characteristic of the amplifier 12, details of which will be described later. The signal processing unit 30 comprises a non-linear processing unit 41, a predistortion processing unit 32 and a D/A converting unit 11.

The non-linear processing unit 41 performs a process with a function representing a reverse characteristic of the input-output characteristic of the amplifier 12, which has been beforehand obtained, on a signal to be transmitted, and outputs the signal. The predistortion processing unit 32 multiplies the output processed by the non-linear processing unit 41 by predetermined coefficient information, and outputs a result as a processed signal. In the non-linear processing unit 41 and the predistortion processing unit 32, the digital processing is performed. The D/A converting unit 11 converts a digital signal to an analog signal. Incidentally, the amplifier 12 and the antenna 13 are identical to those described above, further descriptions of which are thus omitted.

Figure 11:
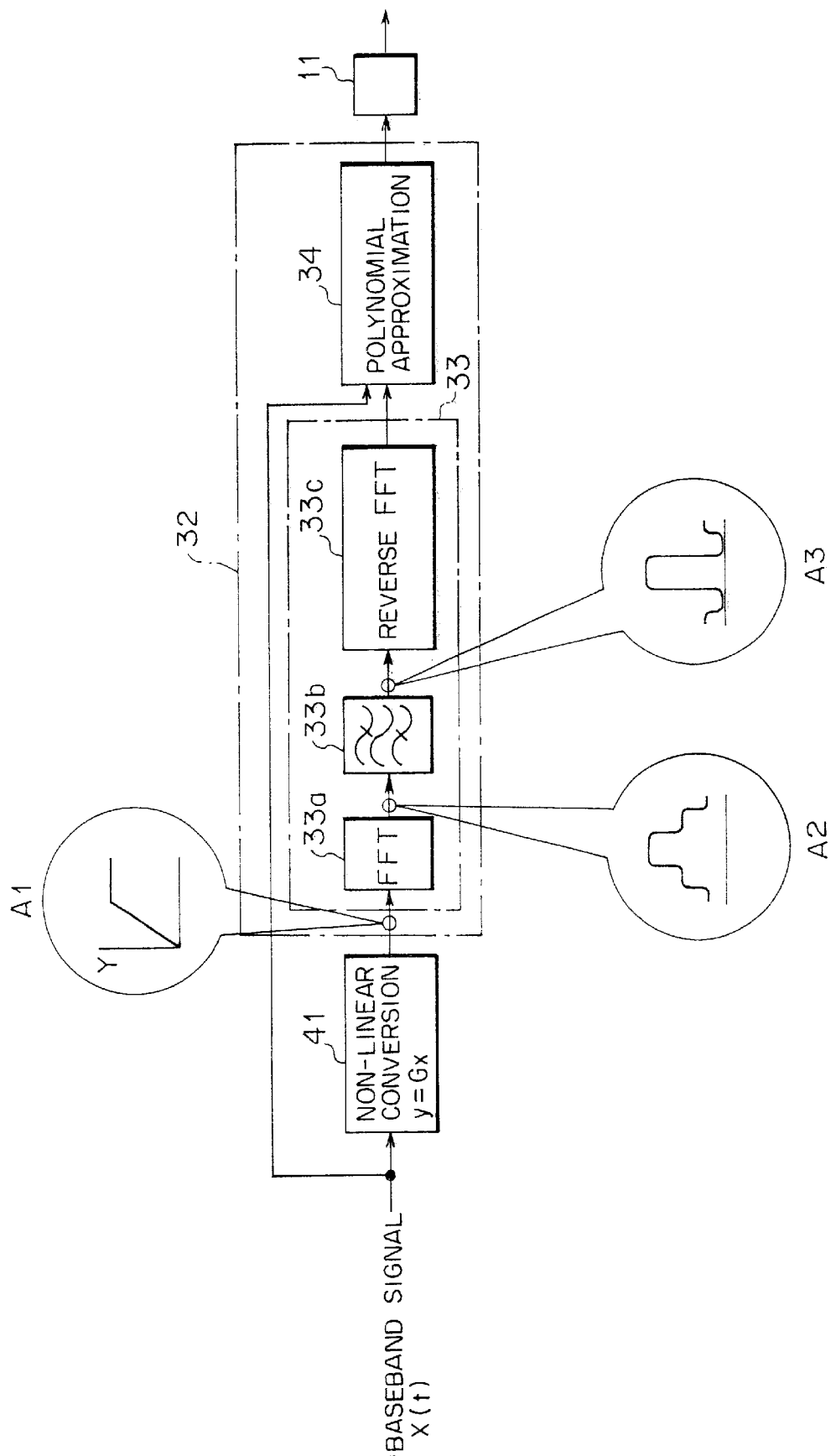
FIG. 11 is a block diagram of the radio transmitter according to the second embodiment of this invention.

FIG. 11 is a block diagram of the radio transmitter according to the second embodiment of this invention. The predistortion processing unit 32 shown in FIG. 11 comprises a frequency component attenuating unit 33 which converts a signal outputted from the non-linear processing unit 41 into a frequency domain, attenuates a desired frequency component, reversely converts an attenuated signal into a time domain and outputs the converted signal, and a coefficient multiplying unit 34 (denoted as polynomial approximation in FIG. 11) which compares the converted signal outputted from the frequency component attenuating unit 33 with a signal to be transmitted, multiplies a power component of an odd-order of the amplitude quantity by desired coefficient information, and outputs a result as a processed signal.

The frequency attenuating unit 33 comprises a fast Fourier transform unit 33a which converts a signal outputted from the non-linear processing unit 41 into a frequency domain, a filter 33b which attenuates a desired frequency component and outputs it, and an inverse fast Fourier transform unit 33c which inversely converts the attenuated signal into a time domain and outputs it.

A method for determining coefficient information on a non-linear component in the predistortion processing unit 32 will be now described with reference to FIG. 11. First, deformation of an ideal input waveform is calculated with y=Gx, and an adjacent channel power thereof is made larger (refer to a frame denoted by A1). Next, the deformed result is converted into a frequency domain using FFT (Fast Fourier Transformation) (refer to a frame denoted by A2), apart of the frequency at which the leakage power is desired to be decreased is filtered to be attenuated (refer to a frame denoted by A3), the result is restored to the time domain using the reverse FFT, the time waveform is compared with the input waveform, the input-output is approximated using a polynomial, whereby coefficient information is determined.

Figure 12:
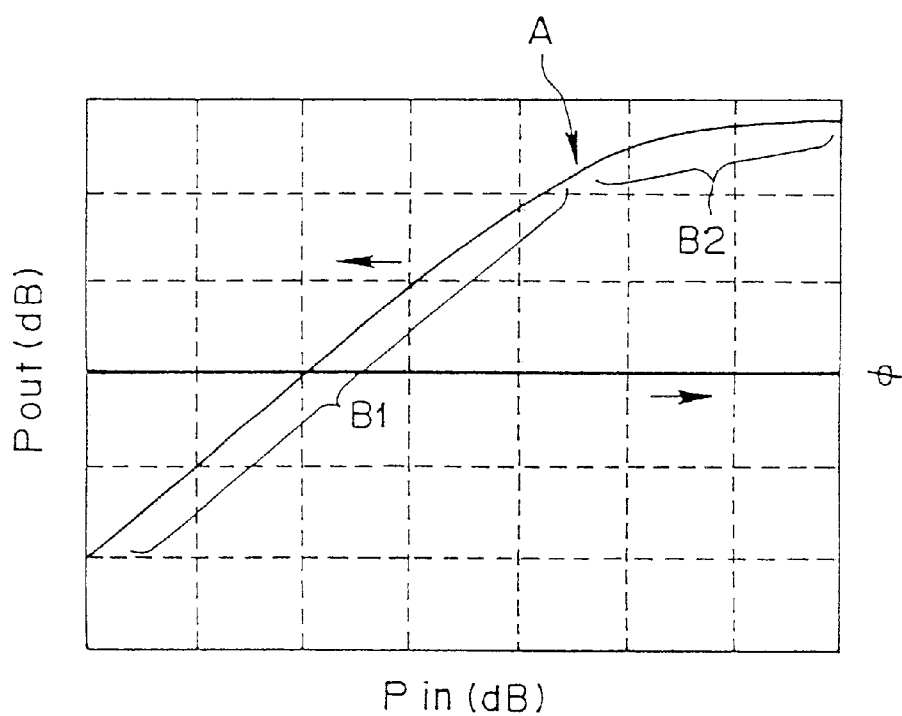
FIG. 12 is a diagram showing an example of an input-output characteristic of an amplifier.

FIG. 12 is a diagram showing an example of the input-output characteristic of the amplifier 12. The horizontal axis in FIG. 12 represents input power (dB), whereas the vertical axis represents output power (dB). A part denoted by B1 is a non-saturation region, whereas a part denoted by B2 is a saturation region.

Meaning of "operating in the non-saturation region" is as follows. The input-output characteristic of the amplifier 12 shown in FIG. 12 is discontinuous at a point (refer to A) where the output changes such as a saturation region (refer to B2). In order to eliminate an effect of distortion of higher order at the discontinuous point in the case which the amplifier 12 is linearized, a non-linear component of the third, fifth, or odd power is made faintly remain when the amplifier 12 is linearized, whereby the input-output characteristic is optimized. The amplifier 12 thereby operates in the non-saturation region (refer to B1), so which a spurious signal is prevented from spreading in a wideband.

Figure 13A:
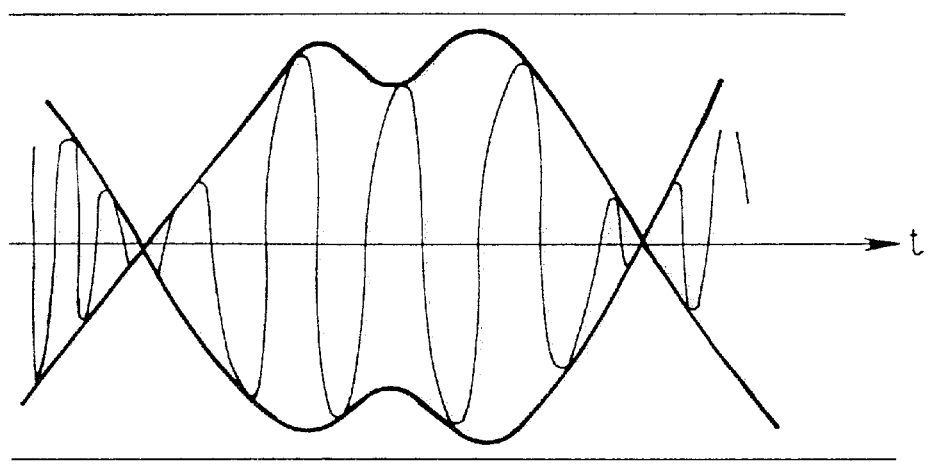
FIG. 13($a$) is a diagram showing a signal waveform having an envelope composed of a fundamental wave and a third-order component.

FIG. 13(a) is a diagram showing a signal waveform having an envelope composed of a fundamental wave and a third-order component. As shown in FIG. 13(a), if the third component signal is added to signals of two waves having an equal amplitude quantity, it is possible to create a signal having an output level which does not exceed the saturation when it is amplified by the amplifier 12. Since the third-order component is created by raising the signal to the third power, the signal cubed is multiplied by appropriate coefficient information, and the result is added to the original signal.

Figure 13B:
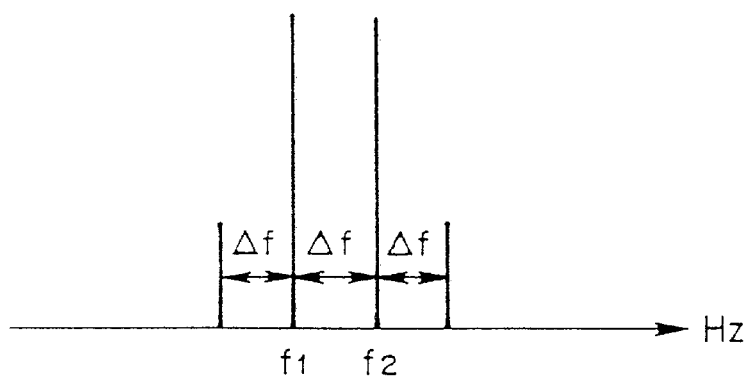

FIG. 13(b) is a diagram showing a signal spectrum of an output waveform in the case where the signal waveform shown in FIG. 13(a) is amplified by the amplifier 12 having the input-output characteristic shown in FIG. 12. As shown in FIG. 13(b), the signal spectrum does not overflow the saturation region, thus spurious components in a wideband do not generate. Namely, by such giving an optimized input-output characteristic which the third-power non-linear component remains to the amplifier 12, the spurious components are prevented from spreading in a wideband.

Figure 14A:
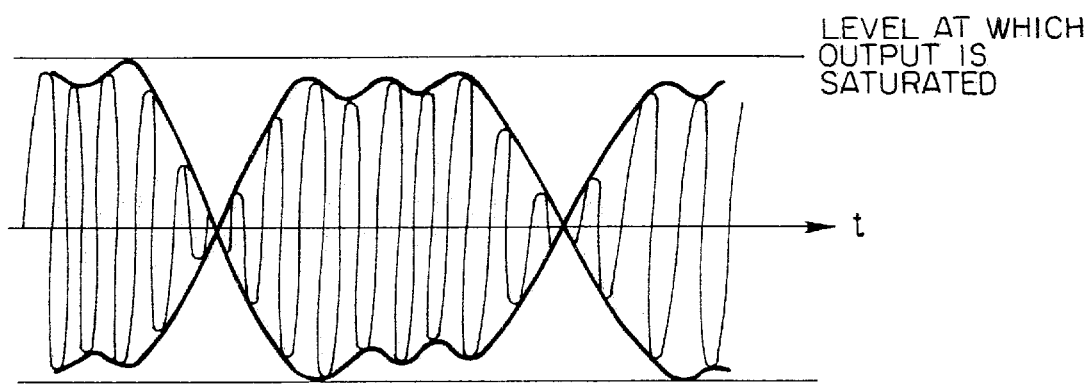
FIG. 14($a$) is a diagram showing a signal waveform having an envelope composed of a fundamental wave and third-order and fifth-order components.

FIG. 14(a) is a diagram showing a signal waveform having an envelope composed of a fundamental wave, and third-order and fifth-order components. As shown in FIG. 14(a) if third-order and fifth-order component signals are added to signals of two waves having an equal amplitude quantity, it is possible to create a signal whose output level does not exceed the saturation region when the signal is amplified by the amplifier 12. Since the third-order component is generated by raising the signal to the third power whereas the fifth component is generated by raising the signal to the fifth power, the third-power and the fifth-power of the signal are multiplied by appropriate coefficient information, and the results are added to the original signal.

Figure 14B:
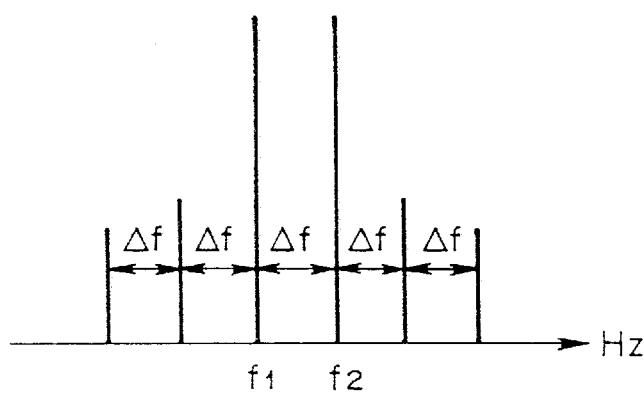

FIG. 14(b) is a diagram showing a signal spectrum having an output waveform in the case where the signal waveform shown in FIG. 14(a) is amplified by the amplifier 12 having the input-output characteristic shown in FIG. 12. As shown in FIG. 14(b), spurious components in a wideband do not generate. Namely, by such optimizing the input-output characteristic of the amplifier 12 which the third-power and fifth-power non-linear components remain, it does not exceed the saturation region.

In FIG. 11, an inputted baseband signal is undergone a process with a function representing an inverted characteristic of the input-output characteristic of the amplifier 12 which has been beforehand obtained in the non-linear processing unit 41, and outputted. The output signal is filtered in the frequency component attenuating unit 33, and outputted. In the coefficient multiplying unit 34, the inputted baseband signal and a signal outputted from the frequency component attenuating unit 33 are compared, a power component of odd order of the amplitude quantity is multiplied by desired coefficient, and the result is outputted as a processed signal through the D/A converting unit 11. In the amplifier 12, the processed signal is power-amplified, then radio-transmitted from the antenna 13 (refer to FIG. 10).

With the above structure, the amplifier 12 is used in such a mode which the amplifier 12 operates in a non-saturation region according to this embodiment. As an example, this will be described with reference to FIGS. 15 and 16 by way of examples in PDC (Personal Digital Cellular Telecommunication System) and CDMA (Code Division Multiple Access).

An example where PDC is applied to the portable telephone standard is as follows. Namely, the input-output characteristic (refer to FIG. 12) is deformed as Equation (12):

$$y = G(x - 9.5858 \times 10^{-2} x^3 + 6.2532 \times 10^{-3} x^5 - \\ 2.0519 \times 10^{-4} x^7 + 2.5791 \times 10^{-6} x^9) \quad (12)$$

where, y is magnitude of a modulated wave component of the output, and G is a gain of the amplifier 12.

Figure 15:
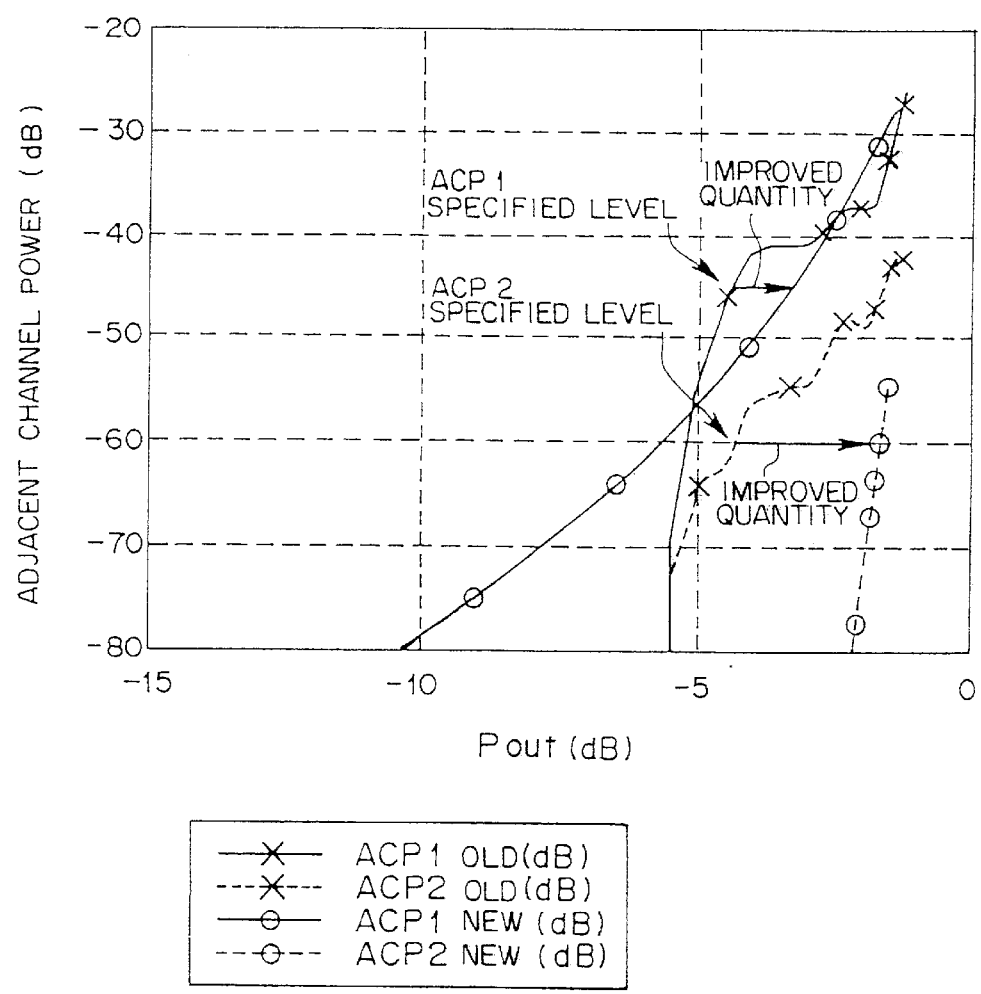
FIG. 15 is a diagram showing a result of comparison between normal linearization and linearlization according to this embodiment in PDC.

FIG. 15 shows a result of comparison between general linearlization and linearlization according to this embodiment in PDC. The horizontal axis in FIG. 15 represents output power of the amplifier 12, whereas the vertical axis represents adjacent channel power of the output power. A curved line marked with cross signs shown in FIG. 15 represents normal deformation with y=Gx, whereas a curved line marked with circle signs represents deformation with Equation (12). The curve marked with the circle signs can more decrease the adjacent channel power than the curve marked with the cross signs.

A case of a communication system in which frequency channels are in close proximity like CDMA is as expressed by Equation (13). Incidentally, the input-output characteristic is as shown in FIG. 12.

$$y = G(x - 3 \times 10^{-2} x^3) \quad (13)$$

Figure 16:
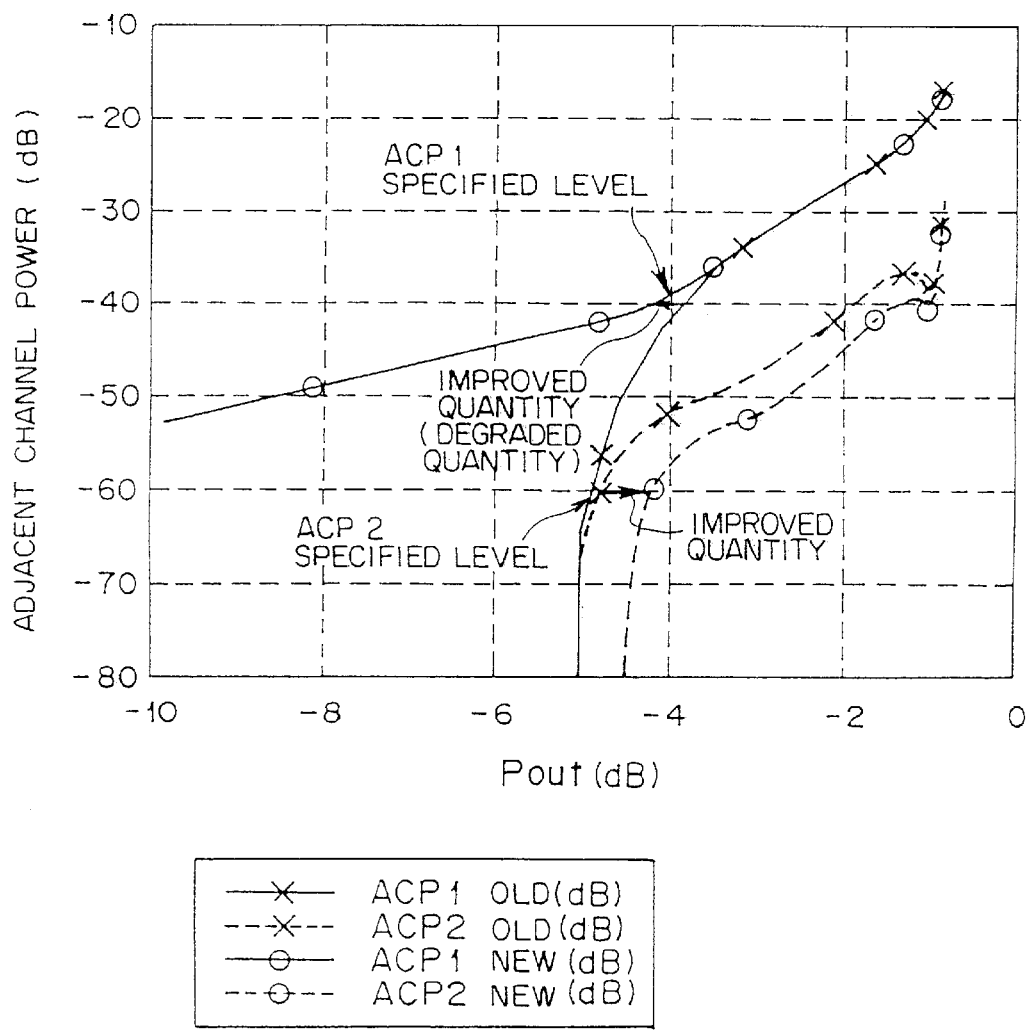
FIG. 16 is a diagram showing a result of comparison between normal linearization and linearlization according to this embodiment in CDMA.

FIG. 16 shows a result of comparison between normal linearlization and linearlization according to this embodiment in CDMA. As shown in FIG. 16, this embodiment can more decrease the adjacent channel power than the case where deformation by y=Gx is performed. In FIG. 16, although ACP1 degrades, an output according to this embodiment satisfying both ACP1 and ACP2 is larger.

As above, by inputting a result obtained by adding a component of the third power, a component of the fifth power, or an addition of the component of the third power and the component of the fifth power to an input signal to the amplifier 12, the amplifier 12 can such operate as not to exceed the saturation region. Even if the input signal is amplified by the amplifier 12 having the input-output characteristic shown in FIG. 12, it is possible to prevent generation of a spurious signal in a wideband.

It is also possible to compensate distortion without an external RF circuit having a linear amplification characteristic. It is thus possible to decrease the circuit size, and contribute to a reduction of the power consumption and allows compactness of a portable telephone or the like.

(B1) Description of First Modification of Second Embodiment of the Invention

Figure 17:
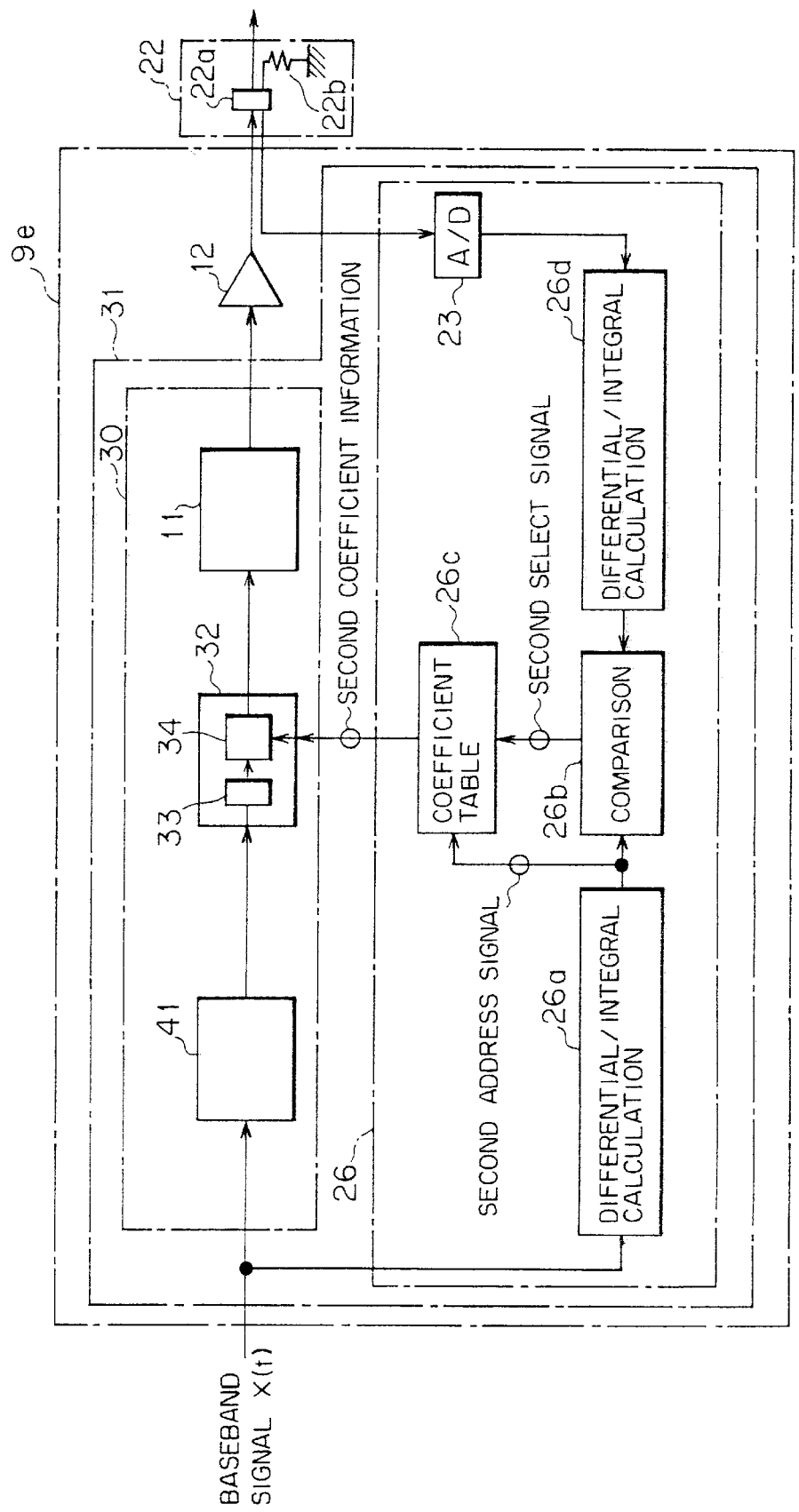
FIG. 17 is a block diagram showing a transmitting unit of a radio transmitter to which a predistortion-type distortion compensation amplifying apparatus according to a first modification of the second embodiment of this invention is applied.
Figure 18:
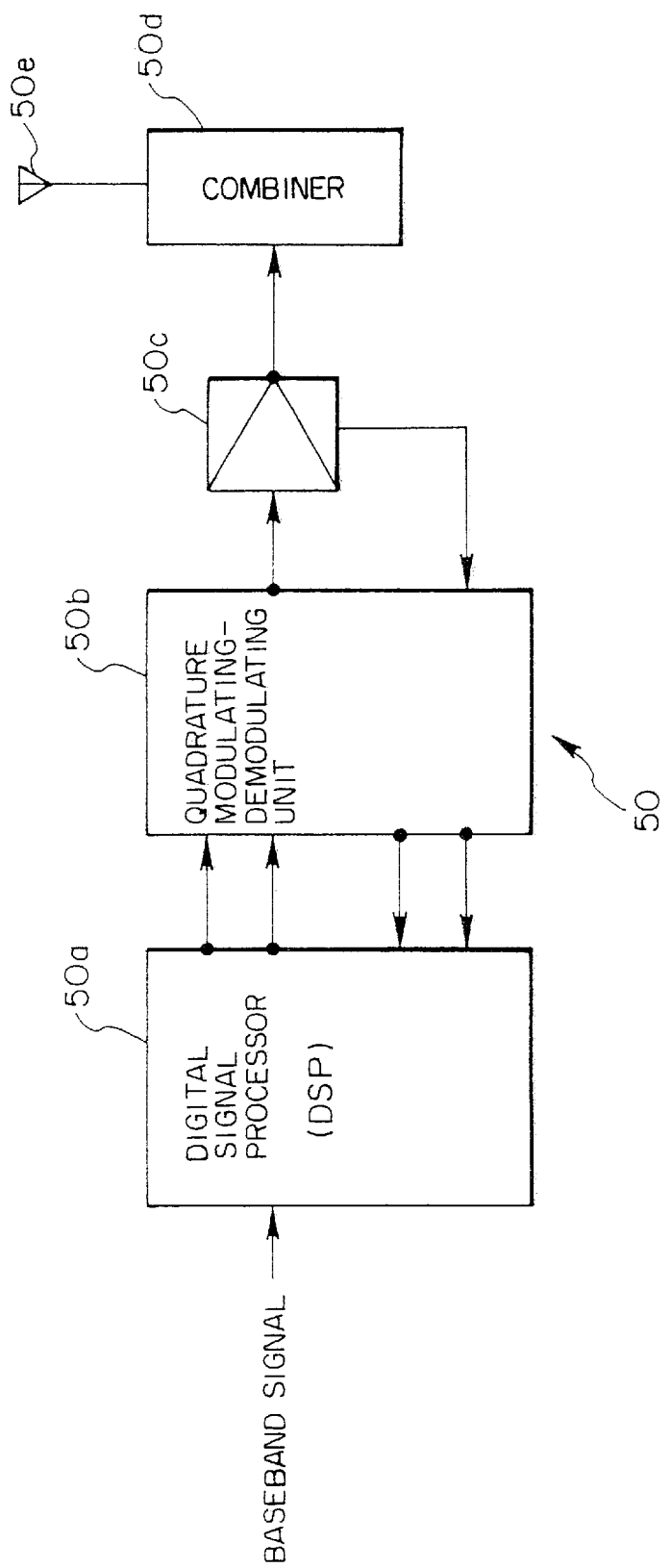
FIG. 18 is a diagram showing an example of a radio transceiver using predistortion.
Figure 19:
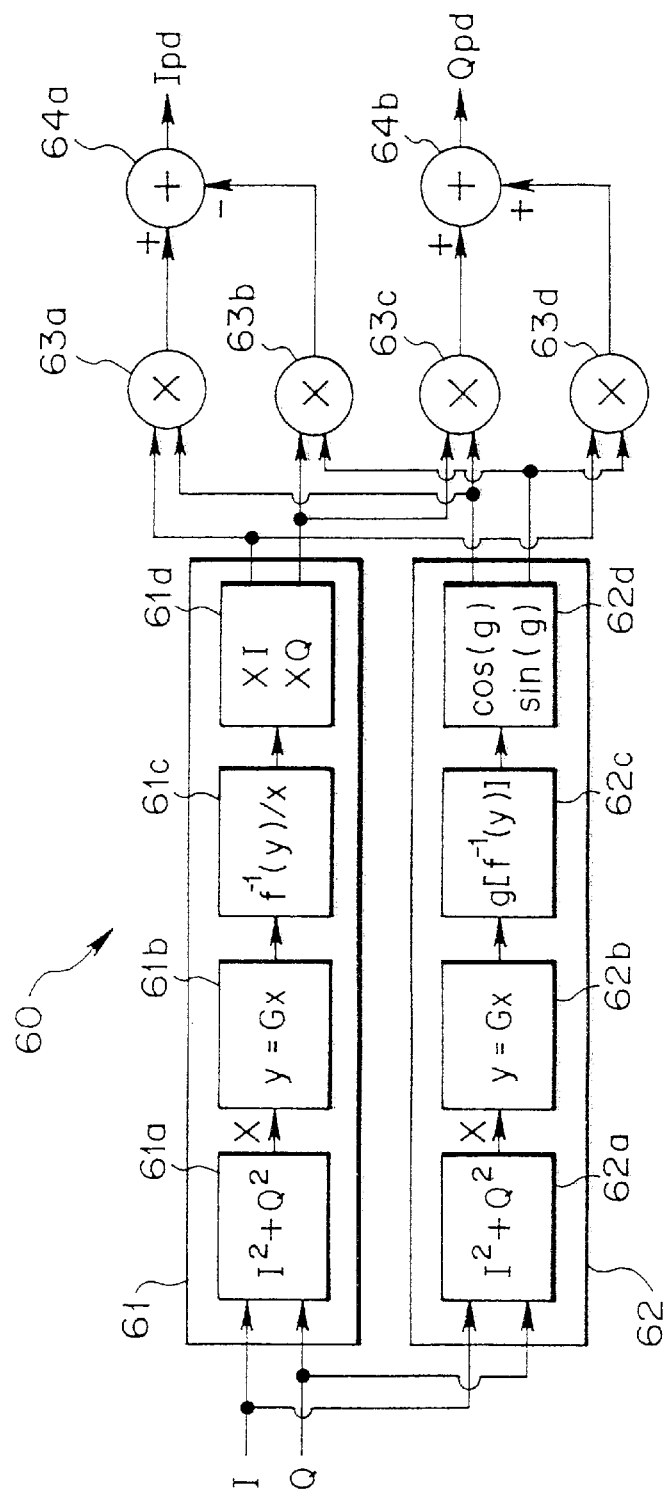
FIG. 19 is a diagram showing an example of a known predistortion circuit.
Figure 20:
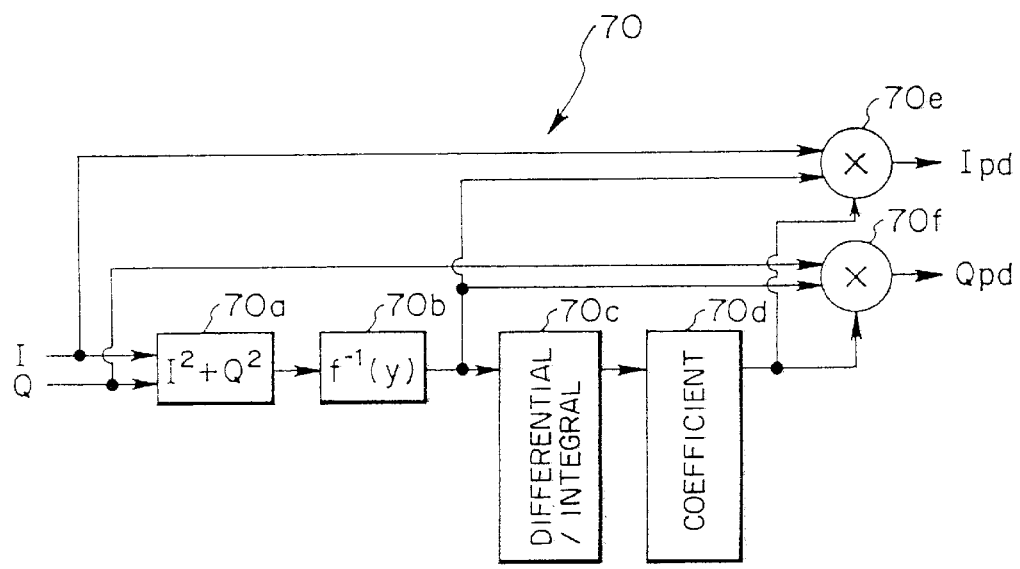
FIG. 20 is a diagram showing an example of a predistortion circuit using a differential value or an integral value of an input signal.
Figure 21A:
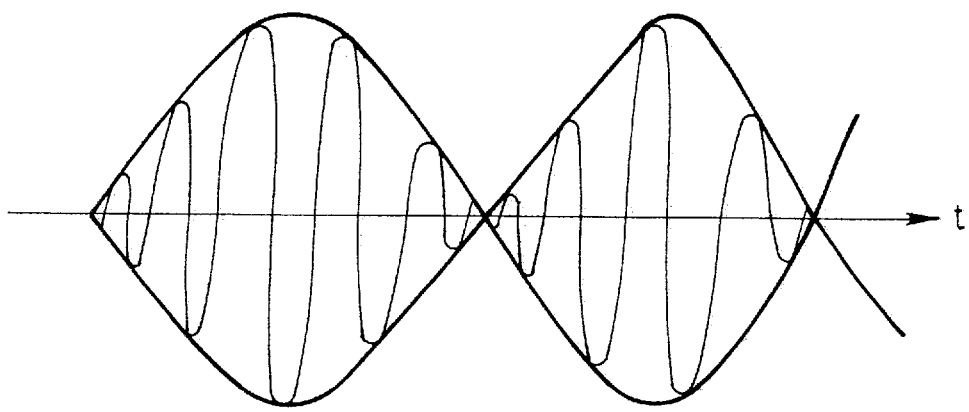
FIG. 21($a$) is a diagram showing an example of a signal waveform in the case where two waves having an equal amplitude are inputted.
Figure 21B:
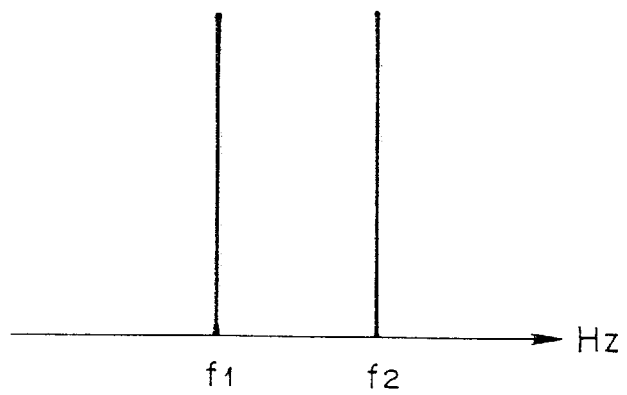
Figure 22:
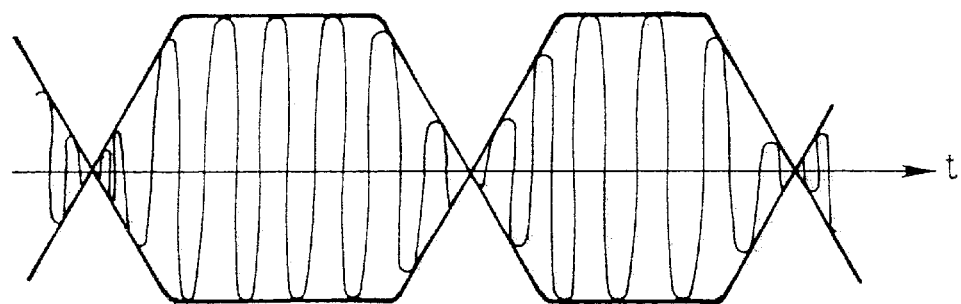
FIG. 22($a$) is a diagram showing an example of a signal waveform in the case where a signal waveform is amplified by an amplifier.
Figure 22:
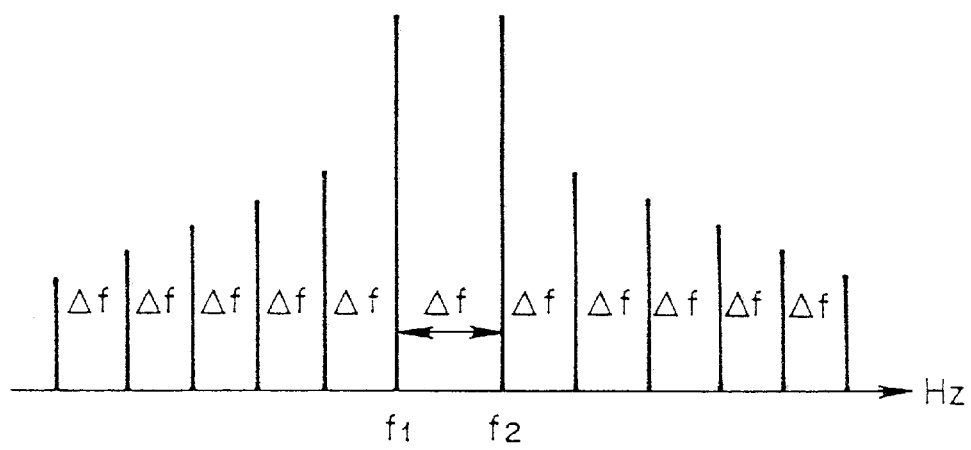
Figure 23:
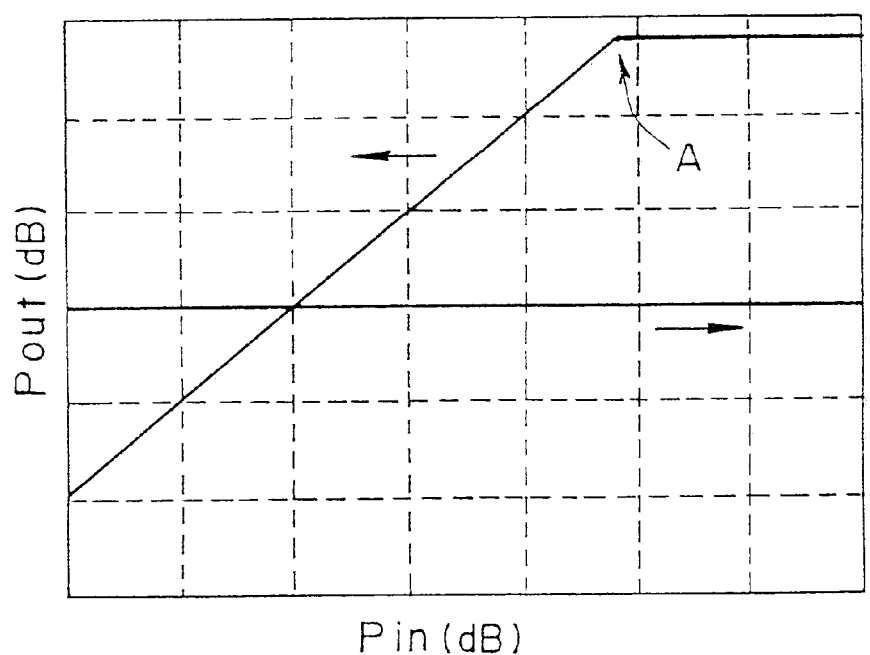
FIG. 23 is a diagram showing an input-output characteristic of a linearized amplifier.

FIG. 17 is a block diagram showing a transmitting unit of a radio transmitter to which a predistortion-type distortion compensation amplifying apparatus according to a first modification of the second embodiment of this invention is applied. In a predistortion-type distortion compensation amplifying apparatus 9e shown in FIG. 17, the differential/integral coefficient information adding unit 26 is added to the predistortion-type distortion compensation amplifying apparatus 9d (refer to FIG. 10). Namely, the predistortion-type distortion compensation amplifying apparatus 9e comprises a signal processing unit 30, an amplifier 12 and the differential/integral coefficient information adding unit 26. A detecting unit 22 is connected to the output's side of the amplifier 12.

The signal processing unit 30 performs a process with a function representing a reverse characteristic of the input-output characteristic of the amplifier 12 on a signal to be transmitted, performs the coefficient changing process to make an odd-order component appear in an output signal of the amplifier 12, whereby the amplifier 12 operates in the non-saturation region. A non-linear processing unit 41, a predistortion processing unit 32 and a D/A converting unit 11 in the signal processing unit 30 are identical to those described in the first and second embodiments, further descriptions of which are thus omitted. Additionally, the amplifier 12 and the detecting unit 22 are identical to those described above, further descriptions of which are thus omitted, as well.

The differential/integral coefficient information adding unit 26 can calculate first differential/integral information from an amplitude quantity of a signal outputted from the amplifier 12, calculate second differential/integral information from an amplitude quantity of a signal to be transmitted, and input second coefficient information derived from the above first differential/integral information and the above second differential/integral information to the coefficient multiplying unit 34 in the signal processing unit 30. The differential/integral coefficient information adding unit 26 comprises a first differential/integral information calculating unit 26a, a second differential/integral information calculating unit 26d, a second coefficient table 26c and a second comparing-rewriting unit 26b.

The first differential/integral information calculating unit 26a can calculate the first differential/integral information from the amplitude quantity of the signal to be transmitted and output it, and input a second address signal obtained from the amplitude quantity of the signal to be transmitted to the second coefficient table 26c. The second differential/integral information calculating unit 26d calculates the second differential/integral information from an amplitude quantity of a signal outputted from the amplifier 12, and outputs it. The second coefficient table 26c can select one of plural pieces of coefficient information according to the second address signal, and output it as the second coefficient information to the signal processing unit 30.

The second comparing-rewriting unit 26b rewrites the second coefficient information according to an error between the above first differential/integral information and the above second differential/integral information. The second comparing-rewriting unit 26b compares the first differential/integral information with the second differential/integral information, and such rewrites the second coefficient information which the error becomes smaller.

For example, absolute values of positive and negative differential coefficients of the second power of amplitude quantities of these which are a part of the signal to be transmitted and a part of the output signal of the amplifier 12 are calculated from these signals, the second coefficient information is such rewritten which an error therebetween is nullified. Another method may be employed as this rewriting method.

In FIG. 17, an inputted baseband signal is undergone a process with a function representing an inverted characteristic of the input-output characteristic of the amplifier 12 which has been beforehand obtained in the non-linear processing unit 41, and outputted. The output signal is filtered by the frequency component attenuating unit 33, and outputted. In the coefficient multiplying unit 34, the inputted baseband signal is compared with a signal outputted from the frequency component attenuating unit 33, a power component of odd order of the amplitude quantity is multiplied by desired coefficient information, and the result is outputted as a processed signal. The processed signal is converted from digital to analog in the D/A converting unit 11, power-amplified in the amplifier 12, and radio-transmitted from the antenna 13 through the detecting unit 22.

With the above structure, by inputting a result obtained by adding a component of the third-power term, a component of the fifth-power term, or both of the component of the third-power term and the component of the fifth-power term to an input signal to the amplifier 12, a non-linear component of the third power, the fifth power or odd power faintly remains on the output's side of the amplifier 12, whereby the amplifier 12 operates, not exceeding the saturation region (refer to FIGS. 13 and 14).

The second coefficient information is determined from a differential value/integral value of the amplitude quantity of the input signal, and the original signal is multiplied by the second coefficient information. The result is outputted as a predistortion signal. A differential value, or an integral value, or the both values of the input signal is compared with a differential value, or an integral value, or the both values of the output, and the second coefficient table 26c is such rewritten which an error therebetween becomes smaller, whereby a signal to be inputted to the amplifier 12 is corrected.

As above, an effect of higher-order distortion at a discontinuous point is eliminated when the amplifier 12 is linearized, it is thereby possible to prevent spurious from spreading in a wideband. Accordingly, distortion compensation without an external RF circuit having a linear amplification characteristic becomes possible, which contributes to a reduction of the power consumption, or a reduction of the circuit size.

A frequency characteristic in the vicinity of higher harmonic in a bias circuit (not shown) of the amplifier 12, a bias circuit (not shown) in the power circuit, or the matching circuit is compensated, thus the accuracy can be improved. It is also possible to cope with a change in characteristics of the amplifier 12 due to a change in temperature or a chage with time.

(C) Others

In the above embodiments and modifications, the present invention is applicoperable to a radio receiver other than a radio transmitter.

The present invention is not limited to the above embodiments and modifications, but may be modified in various ways without departing from the scope of the invention.

For example, as a frequency of a signal to be transmitted, various band may be used, which becomes possible by beforehand calculating coefficient information according to a band to be used.

In the way of determining an error for giving the first select signal or the second select signal to the coefficient table 15 (or 15a, or 15b), or the second coefficient table 26c, various values may be set according to design environments. The coefficient tables 15a and 15b may be separately configured.

As the coefficient information, phase information may be variously combined and used.

INDUSTRIAL APPLICABILITY

As above, the present invention solves a problem which a spurious signal generates in a wide range of frequency, prevents the circuit size from increasing, and contributes to compactness and a reduction of power consumption of an equipment in the mobile communication field such as a portable telephone or the like. Since distortion compensation becomes possible even if a frequency of reference to the memory is slow, and rewriting of the coefficient table becomes possible, it is possible to cope with a change in characteristics of an amplifier due to a change in temperature or a change with time.

What is claimed is:

1. A predistortion-type distortion compensation amplifying apparatus comprising:
    an amplifier for amplifying a signal to be transmitted; and
    a signal processing unit provided on the front side of said amplifier to perform a coefficient changing process to change coefficient information of a power component of an amplitude quantity contained in said signal to be transmitted, and being operable to output a processed signal;
wherein said signal processing unit performs a process with a function representing a reverse characteristic of an input-output characteristic of said amplifier on said signal to be transmitted, performs said coefficient changing process, and makes said amplifier operate in a non-saturation region by optimizing the input-output characteristic so that an odd-order power component of an adjacent channel signal appears in an output signal of said amplifier; and said amplifier operates in a non-saturation region.

2. A predistortion-type distortion compensation amplifying apparatus comprising:
    an amplifier for amplifying a signal to be transmitted; and
    a signal processing unit provided on the front side of said amplifier to perform a coefficient changing process to change coefficient information of a power component of an amplitude quantity contained in said signal to be transmitted, and being operable to output a processed signal;
    wherein said signal processing unit comprises:
        a non-linear processing unit for performing a process with a function representing an reverse characteristic of the input-output characteristic of said amplifier which has been beforehand obtained on said signal to be transmitted, and outputting said signal;
        a frequency component attenuating unit for converting a signal outputted from said non-linear processing unit into a frequency domain, attenuating a desired frequency component, reversely converting an attenuated signal into a time domain, and outputting a converted signal; and
        a coefficient multiplying unit for comparing said converted signal outputted from said frequency component attenuating unit with said signal to be transmitted, multiplying a power component of odd order of said amplitude quantity by said desired coefficient information, and outputting a result as said processed signal.

3. A predistortion-type distortion compensation amplifying apparatus comprising:
    an amplifier for amplifying a signal to be transmitted; and
    a signal processing unit provided on the front side of said amplifier to perform a coefficient changing process to change coefficient information of a power component of an amplitude quantity contained in said signal to be transmitted, and being operable to output a processed signal;
    wherein said signal processing unit comprises a differential/integral coefficient information adding unit being operable to calculate first differential/integral information based on an amplitude quantity of said signal to be transmitted, calculate second differential/integral information from an amplitude quantity of a signal outputted from said amplifier, and input second coefficient information obtained based on said first differential/integral information and said second differential/integral information to said coefficient multiplying unit.

4. A predistortion-type distortion compensation amplifying apparatus comprising:
    an amplifier for amplifying a signal to be transmitted; and
    a signal processing unit provided on the front side of said amplifier to perform a coefficient changing process to change coefficient information of a power component of an amplitude quantity contained in said signal to be transmitted, and being operable to output a processed signal wherein said signal processing unit decreases contribution of a power component of odd order of an amplitude quantity contained in said signal to be transmitted when performing said coefficient changing process and optimizes the input-output characteristic of said amplifier.

5. A predistortion-type distortion compensation amplifying apparatus comprising:
    an amplifier for amplifying a signal to be transmitted; and
    a signal processing unit provided on the front side of said amplifier to perform a coefficient changing process to change coefficient information of a power component of an amplitude quantity contained in said signal to be transmitted, and being operable to output a processed signal;
    wherein said signal processing unit is configured as a signal amplitude change processing unit being operable to output said processed signal in which contribution of a power component of odd order of an amplitude quantity contained in said signal to be transmitted is decreased;
    said signal amplitude change processing unit comprises;
        an odd-order component calculating unit for extracting a power component of odd order of the amplitude quantity contained in said signal to be transmitted, and outputting it;
        a coefficient information outputting unit being operable to select one of plural pieces of said coefficient information according to a signal from the outside, and output the selected one;
        a multiplying unit for multiplying a signal outputted from said odd-order component calculating unit by said coefficient information from said coefficient information outputting unit, and outputting an attenuation signal, and an adding unit for subtracting said attenuation signal from said signal to be transmitted and outputting a result.

6. A predistortion-type distortion compensation amplifying apparatus comprising:

an amplifier for amplifying a signal to be transmitted; and a signal processing unit configured as a signal amplitude change processing unit, provided on the front side of said amplifier to perform a coefficient changing process to change coefficient information of a power component of an amplitude quantity contained in said signal to be transmitted, being operable to output a processed signal, and including a control unit being operable to variably adjust a magnitude of said processed signal and input said processed signal to said amplifier, and input a first address signal for selecting coefficient information of said power component of odd order, said coefficient information being determined according to an average output power which said amplifier will transmit, to said signal amplitude change processing unit, said signal processing unit decreasing contribution of a power component of odd order of an amplitude quantity contained in said signal to be transmitted when performing said coefficient changing process and optimize the input-output characteristic of said amplifier, as well as being configured as the signal amplitude change processing unit operable to output said processed signal which contribution of a power component of odd order of an amplitude quantity contained in said signal to be transmitted is decreased, said signal amplitude change processing unit comprising:
an odd-order component calculating unit for extracting a power component of odd order of the amplitude quantity contained in said signal to be transmitted, and outputting it;
a coefficient information outputting unit being operable to select one of plural pieces of said coefficient information according to a signal from the outside, and output the selected one;
a multiplying unit for multiplying a signal outputted from said odd-order component calculating unit by said coefficient information from said coefficient information outputting unit, and outputting an attenuation signal; and
an adding unit for subtracting said attenuation signal from said signal to be transmitted, and outputting a result.

7. A predistortion-type-distortion compensation amplifying apparatus comprising:

an amplifier for amplifying a signal to be transmitted; and a signal processing unit configured as a signal amplitude change processing unit, provided on the front side of said amplifier to perform a coefficient changing process to change coefficient information of a power component of an amplitude quantity contained in said signal to be transmitted, and being operable to output a processed signal and including an amplitude information comparing unit being operable to input a first select signal obtained based on said signal to be transmitted and a signal outputted from said amplifier to said signal amplitude change processing unit, when an error of comparison between a part of an input and a part of an output is large;

said signal processing unit decreasing contribution of a power component of odd order of an amplitude quantity contained in said signal to be transmitted when performing said coefficient changing process and optimize the input-output characteristic of said amplifier, as well as being configured as the signal amplitude change processing unit operable to output said processed signal which contribution of a power component of odd order of an amplitude quantity contained in said signal to be transmitted is decreased, said signal amplitude change processing unit comprising:
an odd-order component calculating unit for extracting a power component of odd order of the amplitude quantity contained in said signal to be transmitted, and outputting it;
a coefficient information outputting unit being operable to select one of plural pieces of said coefficient information according to a signal from the outside, and output the selected one;
a multiplying unit for multiplying a signal outputted from said odd-order component calculating unit by said coefficient information from said coefficient information outputting unit, and outputting an attenuation signal; and
an adding unit for subtracting said attenuation signal from said signal to be transmitted, and outputting a result.

8. A predistortion-type distortion compensation amplifying apparatus comprising:

an amplifier for amplifying a signal to be transmitted; and a signal processing unit configured as a signal amplitude change processing unit, provided on the front side of said amplifier to perform a coefficient changing process to change coefficient information of a power component of an amplitude quantity contained in said signal to be transmitted, being operable to output a processed signal, and including a differential/integral coefficient information adding unit being operable to calculate first differential/integral information based on the amplitude quantity of said signal to be transmitted, calculate second differential/integral information from an amplitude quantity of a signal outputted from said amplifier, and input second coefficient information obtained based on said first differential/integral information and said second differential/integral information to said signal amplitude change processing unit, said signal processing unit decreasing contribution of a power component of odd order of an amplitude quantity contained in said signal to be transmitted when performing said coefficient changing process and optimize the input-output characteristic of said amplifier, as well as being configured as the signal amplitude change processing unit operable to output said processed signal which contribution of a power component of odd order of an amplitude quantity contained in said signal to be transmitted is decreased, said signal amplitude change processing unit comprising:
an odd-order component calculating unit for extracting a power component of odd order of the amplitude quantity contained in said signal to be transmitted, and outputting it;
a coefficient information outputting unit being operable to select one of plural pieces of said coefficient information according to a signal from the outside, and output the selected one;
a multiplying unit for multiplying a signal outputted from said odd-order component calculating unit by said coefficient information from said coefficient information outputting unit, and outputting an attenuation signal; and an adding unit for subtracting said attenuation signal from said signal to be transmitted, and outputting a result, wherein said multiplying unit multiplying a signal outputted from said adding unit by second coefficient information outputted from said differential/integral coefficient information adding unit, and outputting a result as a processed signal.

9. A predistortion-type distortion compensation amplifying apparatus comprising:

an amplifier for amplifying a signal to be transmitted; and a signal processing unit configured as a signal amplitude change processing unit, provided on the front side of said amplifier to perform a coefficient changing process to change coefficient information of a power component of an amplitude quantity contained in said signal to be transmitted, being operable to output a processed signal, and including a control unit being operable to variably adjust a magnitude of said processes signal and input said processes signal to said amplifier, and input a first address signal for selecting coefficient information of said power component of odd order, said control unit comprising a variable attenuating unit being operable to variably adjust magnitude of said processed signal according to a control signal based on the outside, and input said processed signal to said amplifier); and an output power control unit being operable to control said variable attenuating unit, and input a first address signal for selecting said coefficient information, said coefficient information being determined according to an average output power which said amplifier will transmit, to said signal amplitude change processing unit;

said signal processing unit decreasing contribution of a power component of odd order of an amplitude quantity contained in said signal to be transmitted when performing said coefficient changing process and optimize the input-output characteristic of said amplifier, as well as being configured as the signal amplitude change processing unit operable to output said processed signal which contribution of a power component of odd order of an amplitude quantity contained in said signal to be transmitted is decreased, said signal amplitude change processing unit comprising:

an odd-order component calculating unit for extracting a power component of odd order of the amplitude quantity contained in said signal to be transmitted, and outputting it;

a coefficient information outputting unit being operable to select one of plural pieces of said coefficient information according to a signal from the outside, and output the selected one;

a multiplying unit for multiplying a signal outputted from said odd-order component calculating unit by said coefficient information from said coefficient information outputting unit, and outputting an attenuation signal; and an adding unit for subtracting said attenuation signal from said signal to be transmitted, and outputting a result.

10. The predistortion-type distortion compensation amplifying apparatus according to claim 5, wherein said odd-order component calculating unit (14) comprises a plurality of sub odd-order component calculating units (14a, 14b) for extracting power components for respective odd-order components of the amplitude quantity contained in said signal to be transmitted, and outputs said power components.

11. A predistortion-type distortion compensation amplifying apparatus comprising:

an amplifier for amplifying a signal to be transmitted; and a signal processing unit provided on the front side of said amplifier to perform a coefficient changing process to change coefficient information of a power component of an amplitude quantity contained in said signal to be transmitted, and being operable to output a processed signal, wherein said signal processing unit is configured as a signal amplitude change processing unit and comprises an amplitude information comparing unit being operable to input a first select signal obtained based on said signal to be transmitted and a signal outputted from said amplifier to said signal amplitude change processing unit, wherein said amplitude information comparing unit comprises:

an output amplitude calculating unit for extracting an amplitude quantity based on a signal outputted from said amplifier, and outputting output amplitude information;

an input amplitude calculating unit for extracting an amplitude quantity from said signal to be transmitted, and outputting input amplitude information; and a comparing-rewriting unit being operable to input said first select signal to said signal amplitude change processing unit according to an error between said output amplitude information and said input amplitude information, wherein said comparing-rewriting unit inputs said first select signal to said signal amplitude change processing unit in order to such rewrite said coefficient information which said coefficient information becomes larger when said input amplitude information is smaller than said output amplitude information, whereas inputting said first select signal to said signal amplitude change processing unit in order to such rewrite said coefficient information which said coefficient information becomes smaller when said input amplitude information is larger than said output amplitude information, said first select signal is inputted to a coefficient table for respective orders.

12. The predistortion-type distortion compensation amplifying apparatus according to claim 3, wherein said differential/integral coefficient information adding unit (26) comprises:

a first differential/integral information calculating unit (26a) being operable to calculate first differential/integral information based on the amplitude quantity of said signal to be transmitted and output said first differential/integral information, and input a second address signal obtained based on the amplitude quantity of said signal to be transmitted to said second coefficient information outputting unit (26c);

a second differential/integral information calculating unit (26d) for calculating second differential/integral information from an amplitude quantity of a signal outputted from said amplifier (12), and outputting said second differential/integral information;

a second coefficient information outputting unit (26c) being operable to select one of plural pieces of coefficient information according to said second address signal, and output the selected one as second coefficient information to said coefficient multiplying unit (34); and a second comparing-rewriting unit (26b) being operable to rewrite said second coefficient information according to an error between said first differential/integral information and said second differential/integral information.

13. A predistortion-type distortion compensation amplifying apparatus comprising:

an amplifier for amplifying a signal to be transmitted; and a signal processing unit provided on the front side of said amplifier to perform a coefficient changing process to change coefficient information of a power component of an amplitude quantity contained in said signal to be transmitted, and being operable to output a processed signal, wherein said signal processing unit comprises a differential/integral coefficient information adding unit that includes:

a first differential/integral information calculating unit being operable to calculate first differential/integral information based on the amplitude quantity of said signal to be transmitted and output said first differential/integral information, and input a second address signal obtained from the amplitude quantity of said signal to be transmitted to said second coefficient information outputting unit;

a second differential/integral information calculating unit for calculating second differential/integral information based on an amplitude quantity of a signal outputted from said amplifier, and outputting said second differential/integral information;

a second coefficient information outputting unit being operable to select one of plural pieces of coefficient information according to said second address signal, and output the selected one as second coefficient information to said signal amplitude change processing unit;

a second comparing-rewriting unit being operable to rewrite said second coefficient information according to an error between said first differential/integral information and said second differential/integral information;

said signal processing unit determines in calculation distortion components of powers of said signal to be transmitted, a multiplying unit multiplies said distortion components with coefficient information having an inverted phase, an adding unit subtracts the thus-obtained signal from an input signal, and the signal processing unit corrects a subtracted signal value based on the input signal and an output signal, and inputs this signal to said amplifier.

14. The predistortion-type distortion compensation amplifying apparatus according to claim 12, wherein said second comparing-rewriting unit (26b) compares said first differential/integral information with said second differential/integral information, and such rewrites said second coefficient information which an error therebetween becomes smaller.

* * * * *